(12) United States Patent
Kim et al.

(10) Patent No.: US 12,394,666 B2
(45) Date of Patent: Aug. 19, 2025

(54) METHOD OF MANUFACTURING A SEMICONDUCTOR DEVICE

(71) Applicant: Samsung Electronics Co., Ltd., Suwon-si (KR)

(72) Inventors: Yongmin Kim, Hwaseong-si (KR); Moonjong Kang, Yongin-si (KR); Miyoun Kim, Seongnam-si (KR); Sungil Moon, Suwon-si (KR); Jongsu Park, Hwaseong-si (KR); Heonju Lee, Hwaseong-si (KR); Sunkak Jo, Ansan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 938 days.

(21) Appl. No.: 17/404,136

(22) Filed: Aug. 17, 2021

(65) Prior Publication Data
US 2022/0189823 A1 Jun. 16, 2022

(30) Foreign Application Priority Data

Dec. 10, 2020 (KR) .................. 10-2020-0172574

(51) Int. Cl.
*H01L 21/768* (2006.01)
*H01L 21/311* (2006.01)
(Continued)

(52) U.S. Cl.
CPC .. *H01L 21/76816* (2013.01); *H01L 21/31144* (2013.01); *H10B 43/27* (2023.02); *H10B 43/50* (2023.02)

(58) Field of Classification Search
CPC ......... H01L 21/76816; H01L 21/31144; H01L 2223/54426; H01L 23/544;
(Continued)

(56) References Cited

U.S. PATENT DOCUMENTS

| | | |
|---|---|---|
| 7,916,276 B2 | 3/2011 | Schaar et al. |
| 9,881,874 B2 | 1/2018 | Yasuda et al. |

(Continued)

FOREIGN PATENT DOCUMENTS

| | | |
|---|---|---|
| CN | 107579073 B | 1/2018 |
| CN | 108630660 B | 5/2020 |

(Continued)

*Primary Examiner* — Caleen O Sullivan
(74) *Attorney, Agent, or Firm* — Muir Patent Law, PLLC

(57) ABSTRACT

According to example embodiments, a method of manufacturing a semiconductor device is provided. The method includes forming an etching target layer on a substrate; forming a first photoresist layer on the etching target layer; forming a first alignment key under the first photoresist layer and a first alignment pattern aligned in a first direction perpendicular to a top surface of the substrate, by exposing and developing the first photoresist layer; forming a second alignment key under the first photoresist layer and a second alignment pattern aligned in the first direction, by exposing and developing the first photoresist layer; and forming a third alignment key aligned with the first alignment key in the first direction under the first photoresist layer and a fourth alignment key aligned with the second alignment key in the first direction on the etching target layer based on the first and second alignment patterns.

19 Claims, 28 Drawing Sheets

(51) Int. Cl.
*H10B 43/27* (2023.01)
*H10B 43/50* (2023.01)

(58) Field of Classification Search
CPC ........... H01L 21/31116; H01L 21/0332; H01L 21/0337; H10B 43/27; H10B 43/50; H10B 43/40; G03F 9/7084
USPC ....................................................... 438/268
See application file for complete search history.

(56) References Cited

U.S. PATENT DOCUMENTS

| | | |
|---|---|---|
| 9,929,103 B2 | 3/2018 | Segawa |
| 2015/0079757 A1 | 3/2015 | Jeon et al. |
| 2015/0079791 A1* | 3/2015 | Park .................... H01L 21/3085 438/700 |
| 2018/0070461 A1* | 3/2018 | Lee ...................... G09G 3/3225 |
| 2020/0091182 A1 | 3/2020 | Shishido et al. |
| 2021/0125937 A1* | 4/2021 | Ding .................... H01L 23/544 |
| 2021/0327973 A1* | 10/2021 | Ahn ....................... H10K 59/88 |

FOREIGN PATENT DOCUMENTS

| | | |
|---|---|---|
| CN | 111326526 A | 6/2020 |
| KR | 10-0128833 B1 | 4/1998 |
| KR | 1020070066164 A | 6/2007 |
| KR | 100871751 B1 | 12/2008 |
| KR | 1020150031781 A | 3/2015 |

\* cited by examiner

METHOD OF MANUFACTURING A SEMICONDUCTOR DEVICE

CROSS-REFERENCE TO RELATED APPLICATION

This application is based on and claims priority under 35 U.S.C. § 119 to Korean Patent Application No. 10-2020-0172574, filed on Dec. 10, 2020, in the Korean Intellectual Property Office, the disclosure of which is incorporated by reference herein in its entirety.

BACKGROUND

The inventive concept relates to a method of manufacturing a semiconductor device.

Recently, according to the multi-functionalization of information and communication devices, a large capacity and high integration of memory devices are required. As the size of a memory cell for high integration is reduced, operating circuits and/or a wiring structure included in the memory devices for operation and electrical connection of the memory devices have become more complicated. Accordingly, recently, the application of an extreme ultraviolet (EUV) lithography process is increasing. EUV lithography, a lithography technique using light in the range of, for example, 4 nm to 124 nm, preferably, 13.5 nm, enables ultra-fine processing of less than 20 nm (sub-20 nm), which is difficult to implement with lithography technology using ArF excimer laser light according to the related art.

SUMMARY

The inventive concept provides a method of manufacturing a semiconductor device, whereby production cost may be reduced and productivity may be enhanced.

The problem to be solved by the technical idea of the inventive concept is not limited to the problems mentioned above, and other problems that are not mentioned will be clearly understood by those skilled in the art from the following description.

According to example embodiments for solving the above-described problems, a method of manufacturing a semiconductor device is provided. According to an aspect of the inventive concept, there is provided a method of manufacturing a semiconductor device, the method including forming an etching target layer on a substrate, forming a first photoresist layer on the etching target layer, forming a first alignment key under the first photoresist layer and a first alignment pattern aligned in a first direction perpendicular to a top surface of the substrate, by exposing and developing the first photoresist layer, forming a second alignment key under the first photoresist layer and a second alignment pattern aligned in the first direction, by exposing and developing the first photoresist layer, and forming a third alignment key aligned with the first alignment key in the first direction under the first photoresist layer and a fourth alignment key aligned with the second alignment key in the first direction on the etching target layer based on the first and second alignment patterns.

According to example embodiments, there is provided a method of manufacturing a semiconductor device. According to another aspect of the inventive concept, there is provided a method of manufacturing a semiconductor substrate, the method including forming a peripheral transistor, a first conductive pattern electrically connected to the peripheral transistor, and a first alignment key at the same level as the first conductive pattern on a substrate, forming a mold and a first upper insulating layer, wherein the mold includes a plurality of sacrificial layers and a plurality of insulating layers alternately stacked on the substrate and the first upper insulating layer covers at least part of the mold, forming a plurality of channel structures that vertically penetrate the mold and a second alignment key that vertically penetrates the first upper insulating layer, removing the plurality of sacrificial layers and forming a plurality of gate electrodes in a residual space from which the plurality of sacrificial layers are removed, forming a second upper insulating layer on the first upper insulating layer, forming a first photoresist layer on the second upper insulating layer, forming a first alignment pattern vertically aligned with the first alignment key on the first photoresist layer, forming a second alignment pattern vertically aligned with the second alignment key on the first photoresist layer, and forming third and fourth alignment keys on the second upper insulating layer by using the first photoresist layer on which the first and second alignment patterns are formed, as an etching mask.

According to example embodiments, there is provided a method of manufacturing a semiconductor device. According to another aspect of the inventive concept, there is provided a method of manufacturing a semiconductor substrate, the method including forming a peripheral transistor, a first conductive pattern electrically connected to the peripheral transistor, and a first alignment key at the same level as the first conductive pattern on a substrate, forming a mold and a first upper insulating layer, wherein the mold includes a plurality of sacrificial layers and a plurality of insulating layers that are alternately stacked on the substrate and the first upper insulating layer covers at least part of the mold, forming a plurality of channel structures that vertically penetrate the mold and a second alignment key that vertically penetrates the first upper insulating layer, removing the plurality of sacrificial layers and forming a plurality of gate electrodes in a space from which the plurality of sacrificial layers are removed, forming a second upper insulating layer on the first upper insulating layer, and forming third and fourth alignment keys on the second upper insulating layer, wherein the third alignment key is vertically aligned with the first alignment key, the fourth alignment key is vertically aligned with the second alignment key, and the third and fourth alignment keys are formed substantially at the same time.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
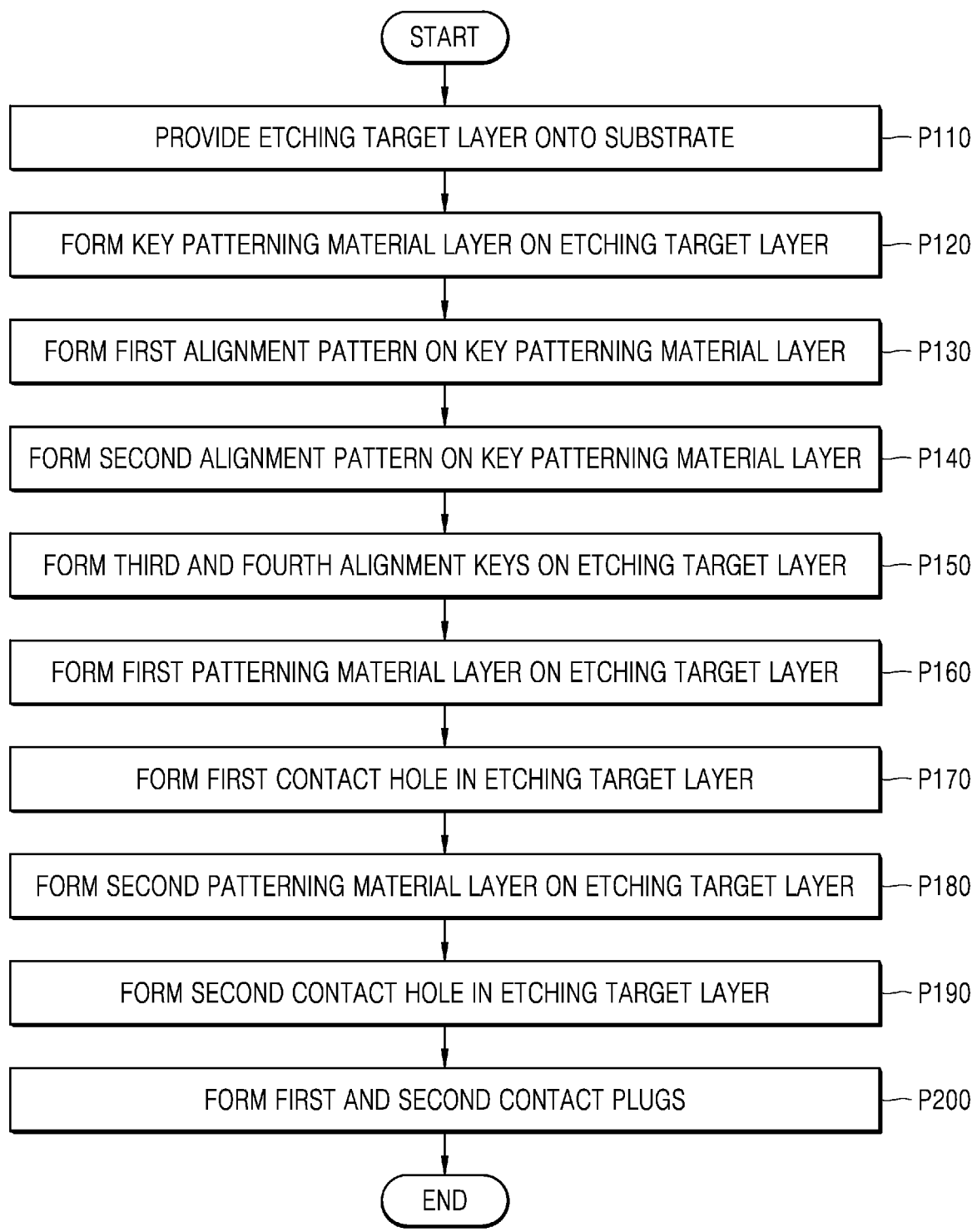
FIG. 1 is a flowchart illustrating a method of manufacturing a semiconductor device, according to example embodiments.

Hereinafter, embodiments of the inventive concept will be described in detail with reference to the accompanying drawings. Like reference numerals are used for like elements in the drawings, and a redundant description therewith will be omitted. In the following drawings, the thickness or size of each layer is exaggerated and expressed for convenience and clarity of description, and accordingly, may be slightly different from the actual shape and ratio.

FIG. 1 is a flowchart illustrating a method of manufacturing a semiconductor device, according to example embodiments.

FIGS. 2 through 12 are cross-sectional views illustrating a method of manufacturing a semiconductor device, according to example embodiments.

Figure 2:
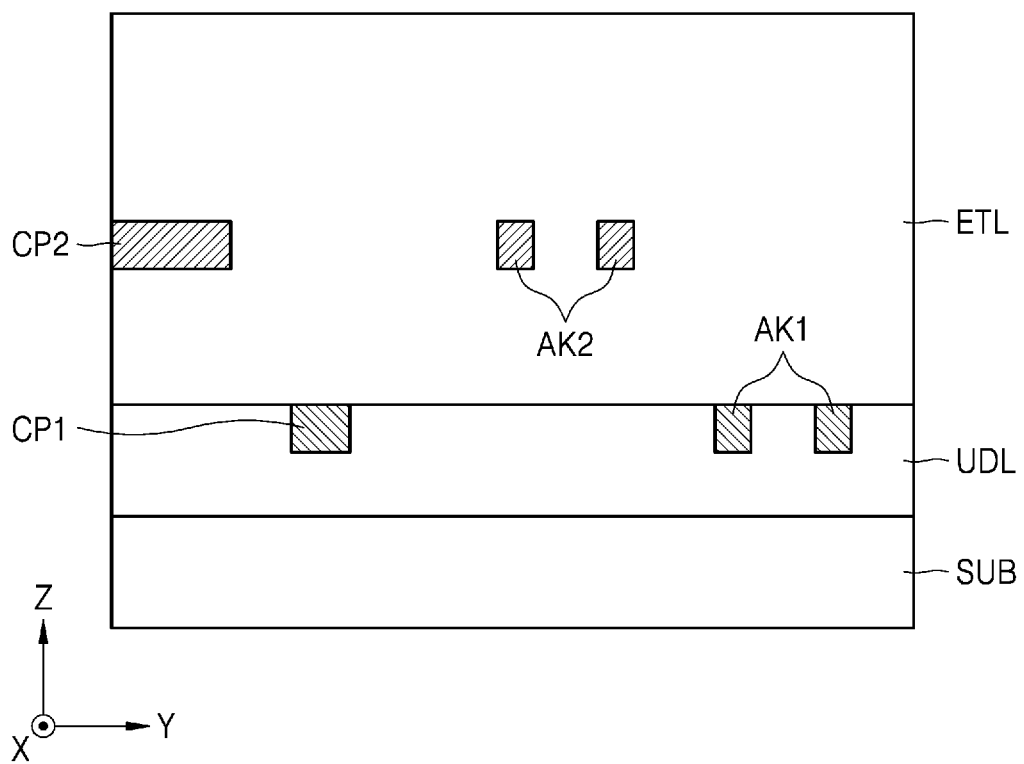
FIGS. 2 through 12 are cross-sectional views illustrating a method of manufacturing a semiconductor device, according to example embodiments.

Referring to FIGS. 1 and 2, in operation P110, an etching target layer ETL may be provided onto a substrate SUB.

Here, the substrate SUB may include a semiconductor element such as germanium (Ge), or a compound semiconductor such as silicon carbide (SiC), gallium arsenide (GaAs), indium arsenide (InAs), and indium phosphide (InP). According to some embodiments, the substrate SUB may have a silicon on insulator (SOI) structure. The substrate SUB may include a buried oxide layer. According to some embodiments, the substrate SUB may include a conductive region, for example, wells doped with impurities. According to some embodiments, the substrate SUB may have various device isolation structures separating the doped wells from each other, such as a shallow trench isolation (STI) structure.

Here, a direction perpendicular to a top surface of the substrate SUB will be defined as a Z-direction, and two directions that are parallel to the top surface of the substrate SUB and perpendicular to each other will be defined as an X-direction and a Y-direction, respectively.

The etching target layer ETL may be a layer that is a target of an etching process in a subsequent process. According to some embodiments, the etching target layer ETL may include an insulating material such as silicon oxide, silicon nitride, and silicon oxynitride. In FIG. 2, although the etching target layer ETL is shown as a single insulating material layer, this is for convenience of description and the technical idea of the inventive concept is not limited thereto. For example, the etching target layer ETL may have various structures such as a structure in which a plurality layers including the same insulating material are stacked, a structure in which layers including different insulating materials are alternately stacked in the Z-direction, and a structure in which layers including different insulating materials are horizontally (X-direction or Y-direction) separated from each other.

An underlying layer UDL may be between the substrate SUB and the etching target layer ETL. The underlaying layer UDL may include an insulating material such as silicon oxide, silicon nitride, and silicon oxynitride.

According to example embodiments, a first conductive pattern CP1 and a first alignment key AK1 may be formed within the underlying layer UDL, and a second conductive pattern CP2 and a second alignment key AK2 may be formed within the etching target layer ETL. In FIG. 2, although the first conductive pattern CP1, the first alignment key AK1, the second conductive pattern CP2, and the second alignment key AK2 are formed one by one, this is for convenience of description and the technical idea of the inventive concept is not limited thereto.

According to example embodiments, the first conductive pattern CP1 and the first alignment key AK1 may be formed substantially at the same time. According to example embodiments, the first conductive pattern CP1 and the first alignment key AK1 may be formed through the same deposition process and the same patterning process. According to example embodiments, a Z-direction distance between the first alignment key AK1 and the substrate SUB may be substantially the same as the Z-direction distance between the first conductive pattern CP1 and the substrate SUB.

Similarly, the second conductive pattern CP2 and the second alignment key AK2 may be formed substantially at the same time through the same deposition process and the same patterning process. According to example embodiments, a Z-direction distance between the second alignment key AK2 and the substrate SUB may be substantially the same as a Z-direction distance between the second conductive pattern CP2 and the substrate SUB.

Here, the first alignment key AK1 may be a pattern that is a reference for aligning a first contact plug (e.g., conductive plug PG1 of FIG. 12) and the first conductive pattern CP1, and the second alignment key AK2 may be a pattern that is a reference for aligning a second contact plug (e.g., conductive plug PG2 of FIG. 12) and the second conductive pattern CP2. As will be described below, first and second contact plugs (e.g., first and second conductive plugs PG1 and PG2 of FIG. 12) may be formed through a lithography process including a spin coating process, an exposure process and a developing process, and an anisotropic etching process based on the lithography process. The first and second alignment keys AK1 and AK2 may be alignment bases for a lithography mask for accurately performing the exposure process.

However, embodiments are not limited thereto, and the first and second alignment keys AK1 and AK2 may serve as overlay keys. The overlay key is a pattern for measuring misalignment between a pattern newly formed on a photoresist layer by the developing process and a pattern previously formed under the photoresist layer. When misalignment between the newly formed pattern and the previously formed pattern is less than or equal to a threshold value, for example, a subsequent process, such as an etching process, may be performed. When the misalignment between the newly formed pattern and the previously formed pattern exceeds the threshold value, after the photoresist layer is removed through a stripping process or the like, the lithography process may be formed again.

Hereinafter, an embodiment in which the first and second alignment keys AK1 and AK2 and third and fourth alignment keys (e.g., third and fourth alignment keys AK3 and AK4 of FIG. 6) formed based on the first and second alignment keys AK1 and AK2 are used in alignment of the lithography process when the exposure process is performed, will be described. However, those skilled in the art will be able to reach embodiments in which the first and second alignment keys AK1 and AK2 and the third and fourth alignment keys (e.g., third and fourth alignment keys AK3 and AK4 of FIG. 6) are overlay keys, based on the description herein.

Each of the exposure process for forming the first and second alignment keys AK1 and AK2 and exposure processes to be described hereinbelow may be an extreme ultraviolet (EUV) exposure process. The EUV exposure process may use, for example, light of a wavelength in the range of 4 nm to 124 nm, preferably, 13.5 nm, and may generally employ a reflection-type lithography mask.

In general, the EUV exposure process may be performed by axial projection (e.g., about 4:1 reduced projection). Because a mask pattern is reduced to the size of about ¼ and transferred to a semiconductor substrate, a full shot may eventually correspond to the size of about ¼ of the entire mask pattern. Here, ¼ may be a reduction ratio of a length and may correspond to a reduction of about 1/16 in terms of area. Thus, because a pattern formed on a lithography mask has a larger critical dimension than that of a pattern actually transferred to a substrate, the reliability of the lithography process may be enhanced.

Here, an exposure method may be classified into a scanning method for continuously photographing and a step method for photographing step by step. In general, the EUV exposure process may be performed in a scanning method, and an EUV exposure device is generally also referred to as a scanner. In addition, in the EUV exposure device, scanning may be performed using a slit for limiting light to a partial region of a mask. Here, the slit may be a unit that restricts light in an apparatus for performing the EUV exposure process so that light may be uniformly irradiated with an EUV mask. The light may be limited to be irradiated to a partial region of the mask through a slit, and the light may be continuously irradiated by moving the mask in a direction opposite to a direction to be scanned. In this way, a region irradiated with light on a substrate through scanning over the entire region of the mask may be a region corresponding to the full shot.

According to example embodiments, the Z-direction distance between the substrate SUB and the first alignment key AK1 may be different from the Z-direction distance between the substrate SUB and the second alignment key AK2. According to example embodiments, the Z-direction distance between the substrate SUB and the first alignment key AK1 may be less than the Z-direction distance between the substrate SUB and the second alignment key AK2.

Figure 3:
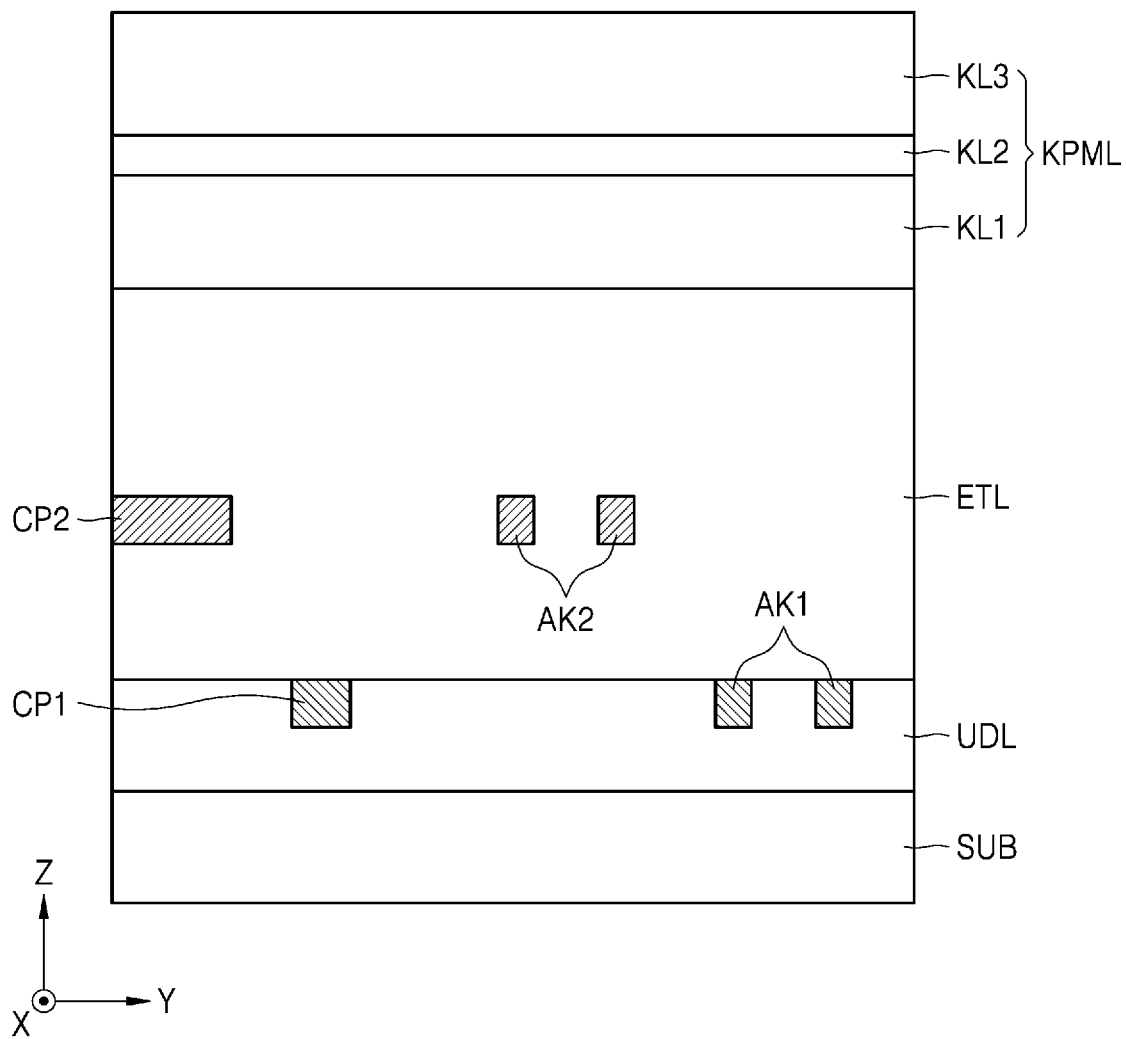

Referring to FIGS. 1 and 3, in operation P120, a key patterning material layer KPML may be formed on the etching target layer ETL.

According to example embodiments, the key patterning material layer KPML may include first through third layers KL1, KL2, and KL3. The first layer KL1 may include amorphous carbon, and the second layer KL2 may include silicon oxynitride, and the third layer KL3 may include a photoresist material.

Figure 4:
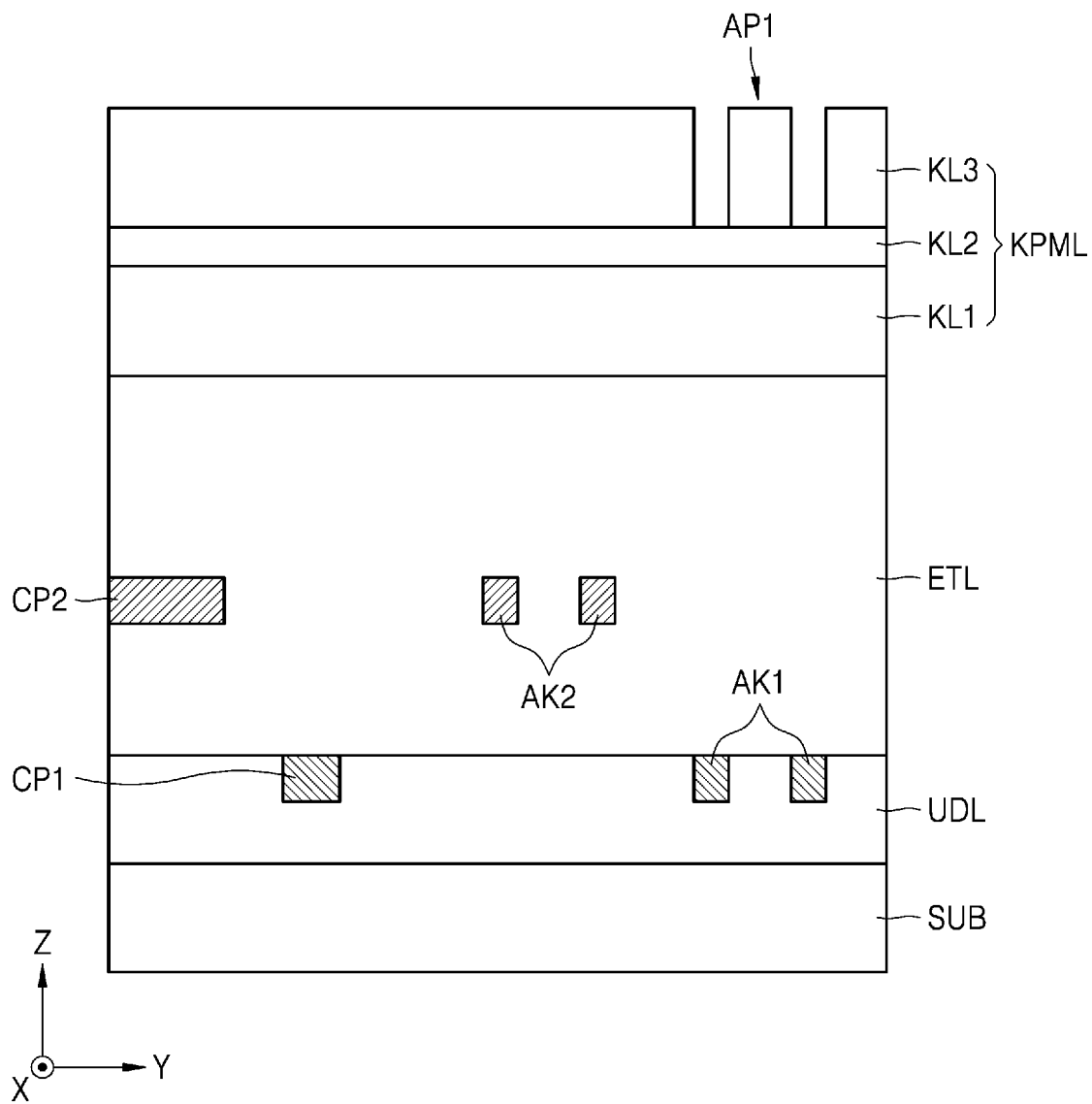

Referring to FIGS. 1 and 4, in operation P130, a first alignment pattern AP1 may be formed on the key patterning material layer KPML.

According to example embodiments, the first alignment pattern AP1 may be formed through exposure and developing processes. The first alignment pattern AP1 may be a pattern for forming a third alignment key (e.g., third alignment key AK3 of FIG. 6) aligned with the first alignment key AK1 on the etching target layer ETL.

According to example embodiments, the first alignment pattern AP1 and the first alignment key AK1 may overlap each other in the Z-direction. In FIG. 3, the first alignment pattern AP1 and the first alignment key AK1 have substantially the same horizontal lengths (e.g., an X-direction length and a Y-direction length). For example, when viewed in a plan view, the surface area of the first alignment pattern AP1 and the first alignment key AK1 may be substantially the same. However, embodiments are not limited thereto. For example, the first alignment pattern AP1 may have larger X-direction length and Y-direction length than those of the first alignment key AK1, or the first alignment pattern AP1 may have smaller X-direction and Y-direction lengths than those of the first alignment key AK1.

Figure 5:
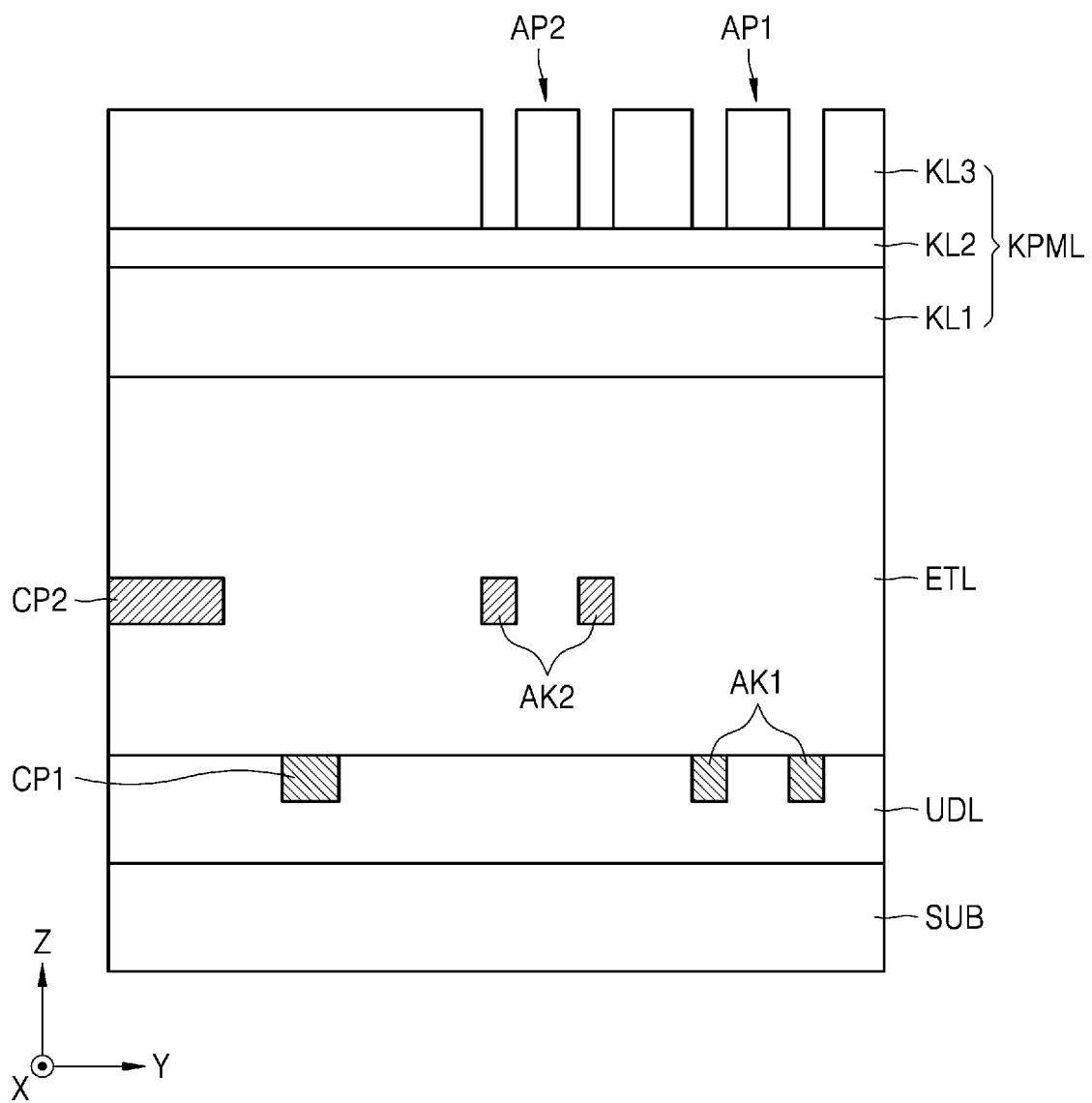

Referring to FIGS. 1 and 5, in operation P140, a second alignment pattern AP2 may be formed on the key patterning material layer KPML.

According to example embodiments, the second alignment pattern AP2 may be formed through the exposure and developing processes. The second alignment pattern AP2 may be a pattern for forming a fourth alignment key (e.g., fourth alignment key AK4 of FIG. 6) aligned with the second alignment key AK2 on the etching target layer ETL.

According to example embodiments, the second alignment pattern AP2 and the second alignment key AK2 may overlap each other in the Z-direction. In FIG. 3, the second alignment pattern AP2 and the second alignment key AK2 have substantially the same horizontal lengths (e.g., the X-direction length and a Y-direction length). For example, when viewed in a plan view, the surface area of the second alignment pattern AP2 and the second alignment key AK2 may be substantially the same. However, embodiments are not limited thereto. For example, the second alignment pattern AP2 may have larger X-direction and Y-direction lengths than those of the second alignment key AK2, or the second alignment pattern AP2 may have smaller X-direction and Y-direction lengths than those of the second alignment key AK2.

In FIGS. 4 and 5, after a first exposure process and a first developing process for forming the first alignment pattern AP1 are performed, a second exposure process and a second developing process for forming the second alignment pattern AP2 are performed. However, in some cases, after the first exposure process for forming the first alignment pattern AP1 is performed, a second exposure process for forming the second alignment pattern AP2 may be performed before the developing process. In this case, the first and second alignment patterns AP1 and AP2 may be substantially and simultaneously formed through the first and second exposure processes which are sequentially performed at different times in a single developing process.

Figure 6:
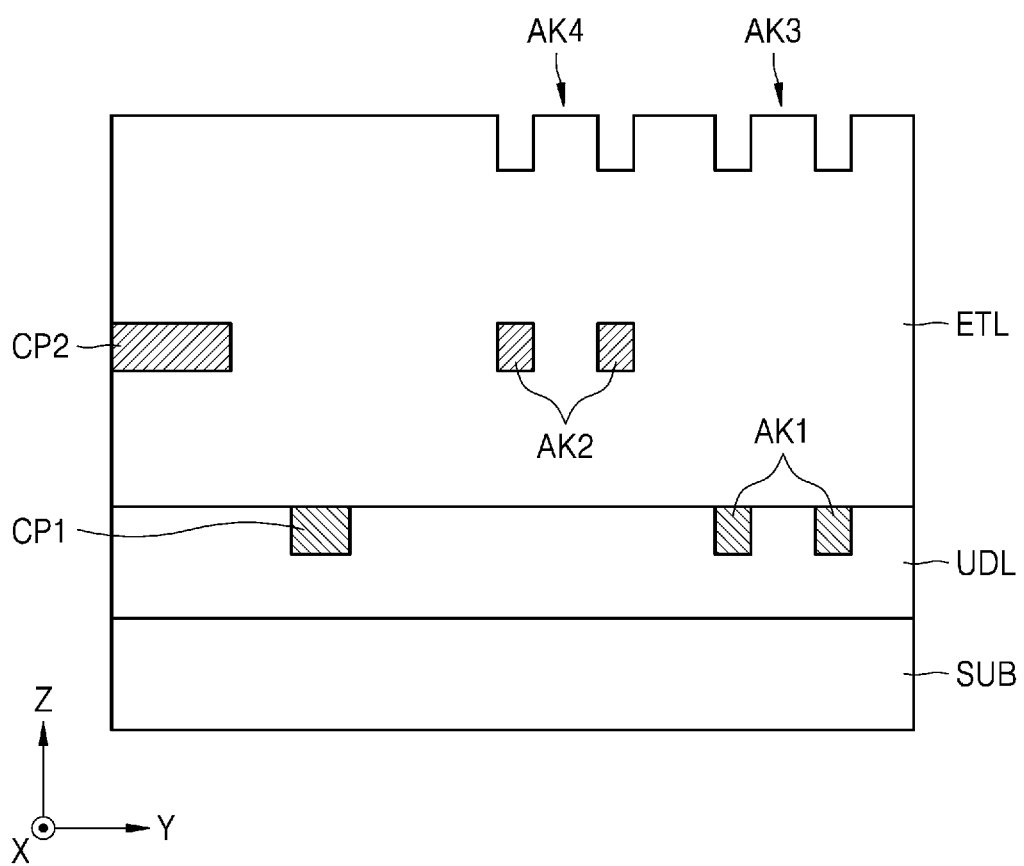

Subsequently, referring to FIGS. 1, 5, and 6, in operation P150, third and fourth alignment keys AK3 and AK4 may be formed on the etching target layer ETL.

Forming of the third and fourth alignment keys AK3 and AK4 may include etching first and second layers KL1 and KL2 that are hard mask layers by using a third layer KL3 on which the first and second alignment patterns AP1 and AP2 are formed, as an etching mask, and etching the etching target layer ETL by using the etched first and second layers KL1 and KL2 as an etching mask.

According to example embodiments, the third and fourth alignment keys AK3 and AK4 may be formed by partially etching an upper portion of the etching target layer ETL through dry etching, such as reactive ion etching (RIE), deep RIE (DRIE), ion beam etching (IBE), Ar milling, and atomic layer etching (ALE). However, embodiments are not limited thereto, and the third and fourth alignment keys AK3 and AK4 may also be formed through a wet etching process. The wet etching process may be an etching process in which at least one of $Cl_2$, $HCl$, $CHF_3$, $CH_2F_2$, $CH_3F$, $H_2$, $BCL_3$, $SiCl_4$, $Bra$, $HBr$, $NF_3$, $CF_4$, $C_2F_6$, $C_4F_8$, $SF_6$, $O_2$, $SO_2$, and $COS$ is used as an etchant gas.

According to example embodiments, the first alignment key AK1 and the third alignment key AK3 may overlap each other in the Z-direction, and the second alignment key AK2 and the fourth alignment key AK4 may overlap each other in the Z-direction.

According to example embodiments, after the third and fourth alignment keys AK3 and AK4 are formed, the first through third layers KL1, KL2, and KL3 may be removed.

Figure 7:
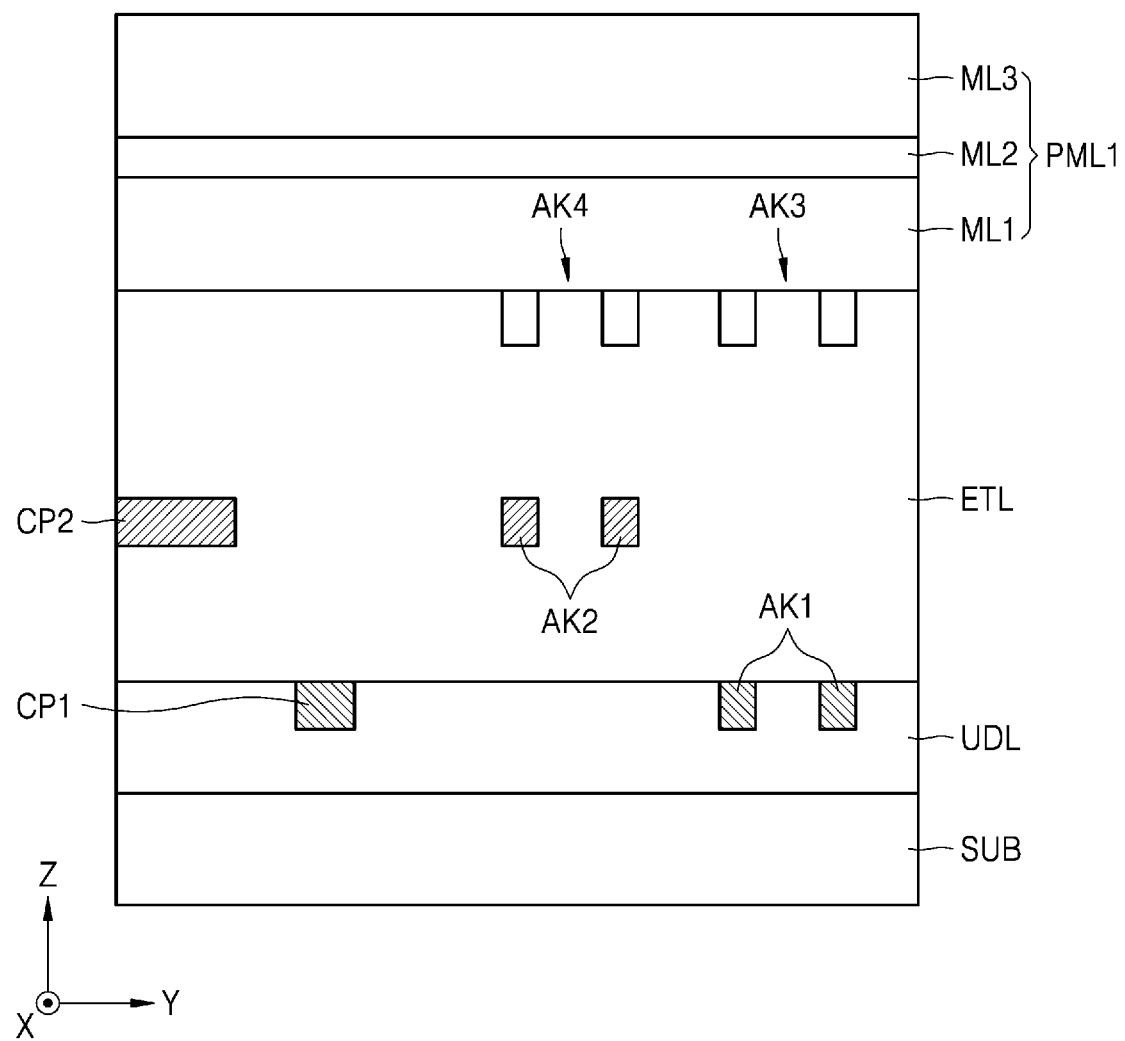

Referring to FIGS. 1 and 7, in operation P160, a first patterning material layer PML1 may be formed on the etching target layer ETL.

According to example embodiments, the first patterning material layer PML1 may include first through third layers ML1, ML2, and ML3. The first layer ML1 may include amorphous carbon, the second layer ML2 may include silicon oxynitride, and the third layer ML3 may include a photoresist material.

According to example embodiments, the first layer ML1 may include a material different from that of the first layer of the key patterning material layer KPML (e.g., first layer KL1 of FIG. 2). According to example embodiments, the first layer ML1 may be an amorphous carbon layer having a composition different from that of the first layer of the key patterning material layer KPML (e.g., first layer KL1 of FIG. 2). For example, the first layer ML1 may have a higher etch rate and a lower transmittance compared to the first layer of the key patterning material layer KPML (e.g., first layer KL1 of FIG. 2). According to example embodiments, the first layer ML1 and the first layer of the key patterning material layer KPML (e.g., first layer KL1 of FIG. 2) may be formed through a chemical vapor deposition (CVD) process, and a second temperature at which the first layer ML1 is formed, may be higher than a first temperature at which the first layer of the key patterning material layer KPML (e.g., first layer KL1 of FIG. 2) is formed.

Figure 8:
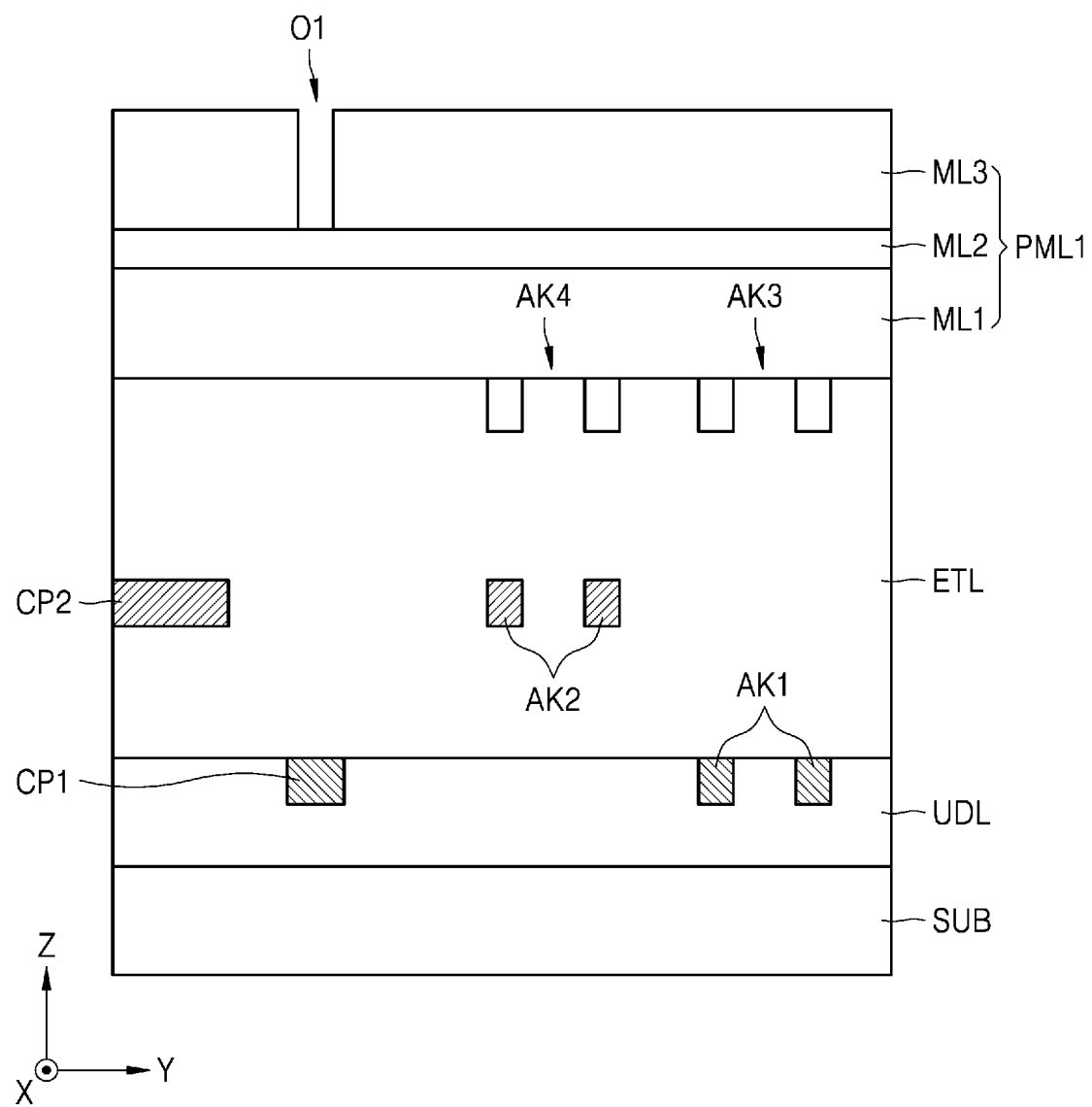
Figure 9:
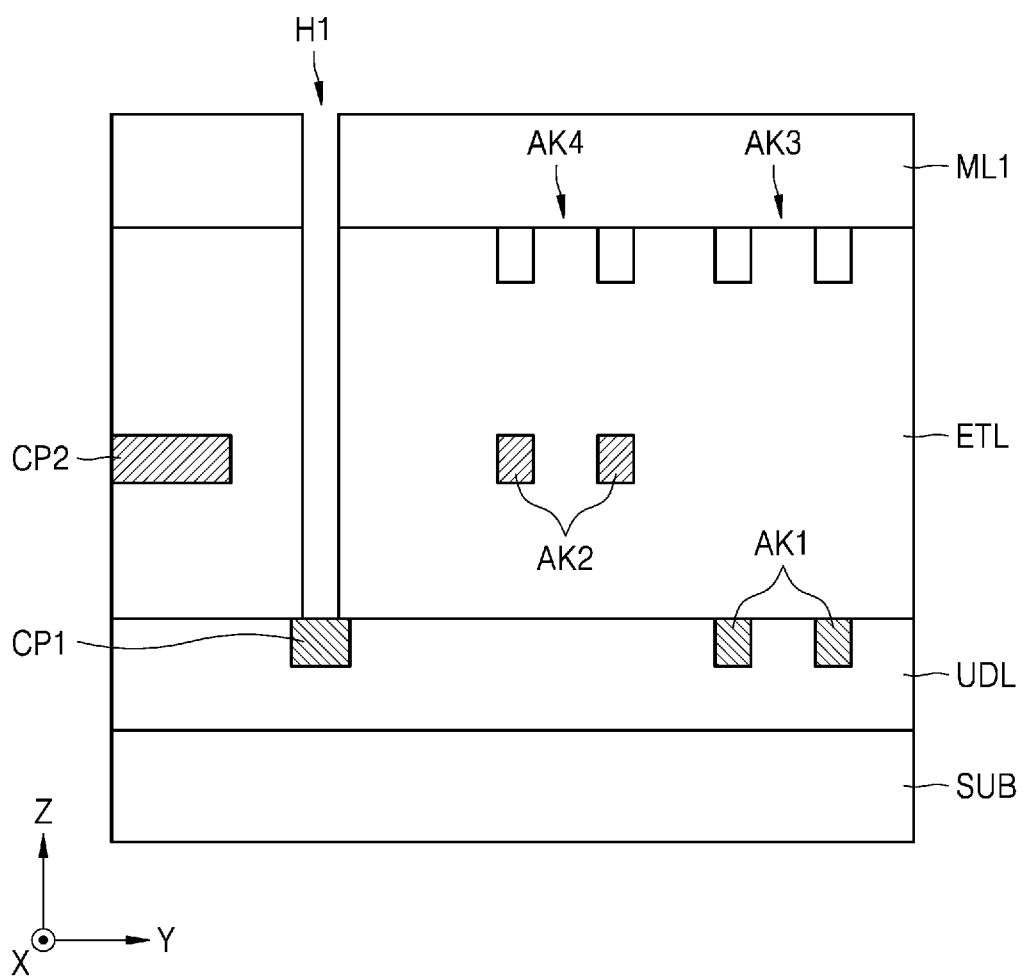

Referring to FIGS. 1, 8, and 9, in operation P170, a first contact hole H1 may be formed in the etching target layer ETL.

More specifically, referring to FIG. 8, a first opening O1 that horizontally overlaps a first conductive pattern CP1 may be formed in the third layer ML3. The first opening O1 may be formed through exposure and developing processes of the third layer ML3 including a photoresist material. According to example embodiments, because the third alignment key AK3 is formed at an upper portion the etching target layer ETL, the position of the third alignment key AK3 may be accurately identified in spite of the low transmittance of the first layer ML1. Thus, the reliability of the exposure process for forming the first opening O1 may be enhanced.

Subsequently, referring to FIG. 9, the etching target layer ETL may be etched by using the first patterning material layer PML1 on which the first opening O1 is formed, as an etching mask, so that the first contact hole H1 exposing a top surface of the first conductive pattern CP1 and extending in the Z-direction may be formed. As the first contact hole H1 is formed, upper portions of the second and third layers ML2 and ML3 and the first layer ML1 may be removed. After the first contact hole H1 is formed, the first layer ML1 may be removed for performing a subsequent process.

Figure 10:
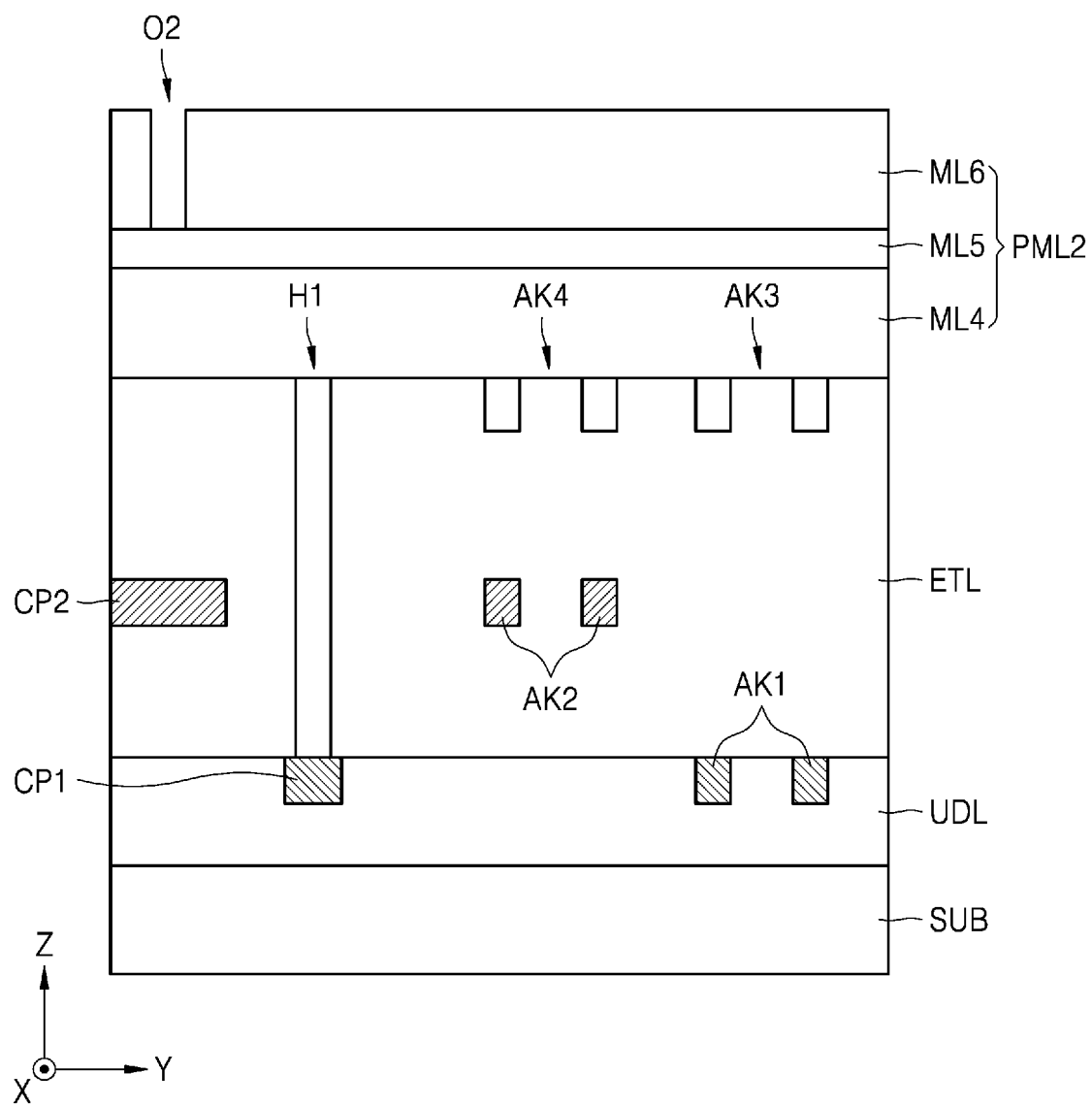

Referring to FIGS. 1 and 10, in operation P180, a second patterning material layer PML2 may be formed on the etching target layer ETL.

According to example embodiments, the second patterning material layer PML2 may include fourth through sixth material layers ML4, ML5, and ML6. The fourth layer ML4 may include amorphous carbon, the fifth layer ML5 may include silicon oxynitride, and the sixth layer ML6 may include a photoresist material.

According to example embodiments, the fourth layer ML4 may include a material different from that of the first layer of the key patterning material layer KPML (e.g., first layer KL1 of FIG. 2). For example, the fourth layer ML4 may have a higher etch rate and a lower transmittance compared to the first layer of the key patterning material layer KPML (e.g., first layer KL1 of FIG. 2). According to example embodiments, the fourth layer ML4 may be formed through a CVD process. A third temperature at which the fourth layer ML4 is formed, may be higher than a first temperature at which the first layer of the key patterning material layer KPML (e.g., first layer KL1 of FIG. 2) is formed.

In addition, similarly to the description with reference to FIG. 8, the exposure and developing processes are performed based on the fourth alignment key AK4 so that a second opening O2 may be formed.

Figure 11:
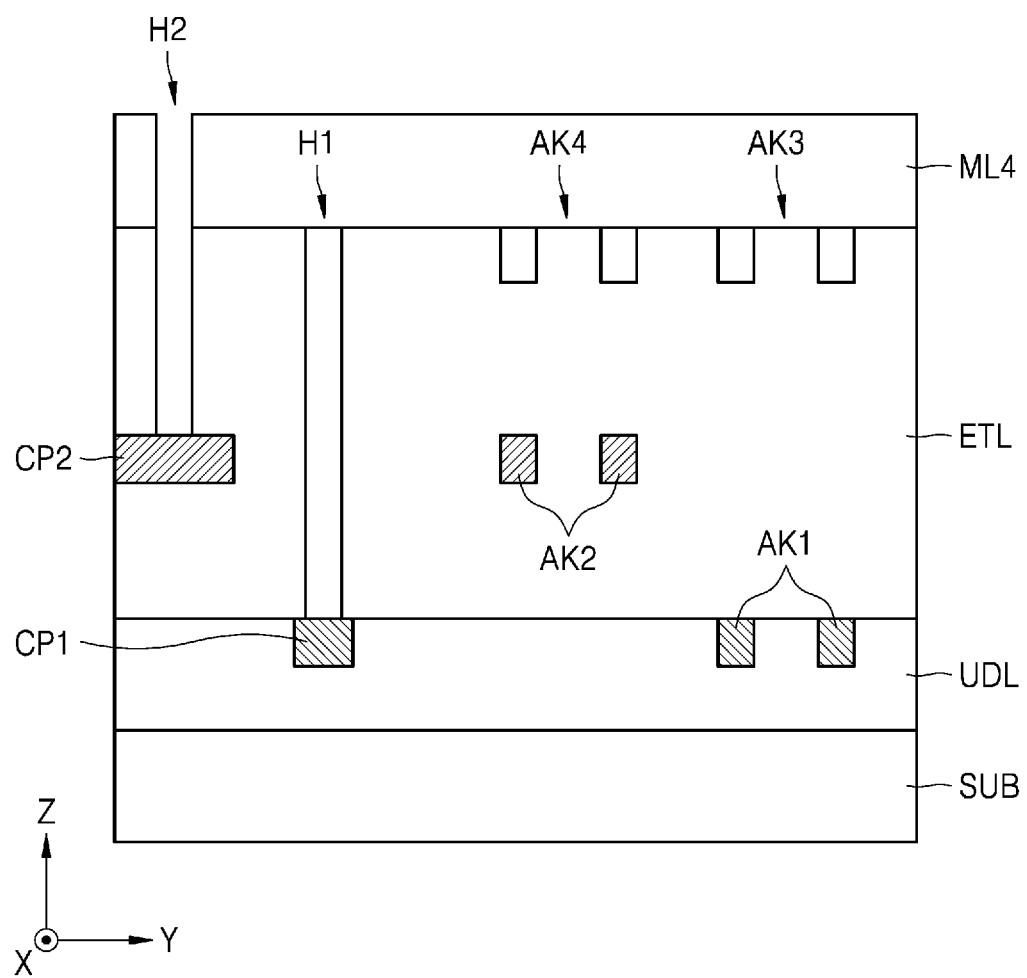

Referring to FIGS. 1, 10, and 11, in operation P190, a second contact hole H2 may be formed in the etching target layer ETL. The etching target layer ETL may be etched by using the second patterning material layer PML2 in which the second opening O2 is formed, as an etching mask so that a third contact hole H2 exposing the top surface of the second conductive pattern CP2 and extending in the Z-direction may be formed. According to example embodiments, upper portions of the sixth layer ML6, the fifth layer ML5, and the fourth layer ML4 may be removed by etching of the second contact hole H2, but embodiments are not limited thereto. After the second contact hole H2 is formed, the fourth layer ML4 may be removed for performing of a subsequent process.

Figure 12:
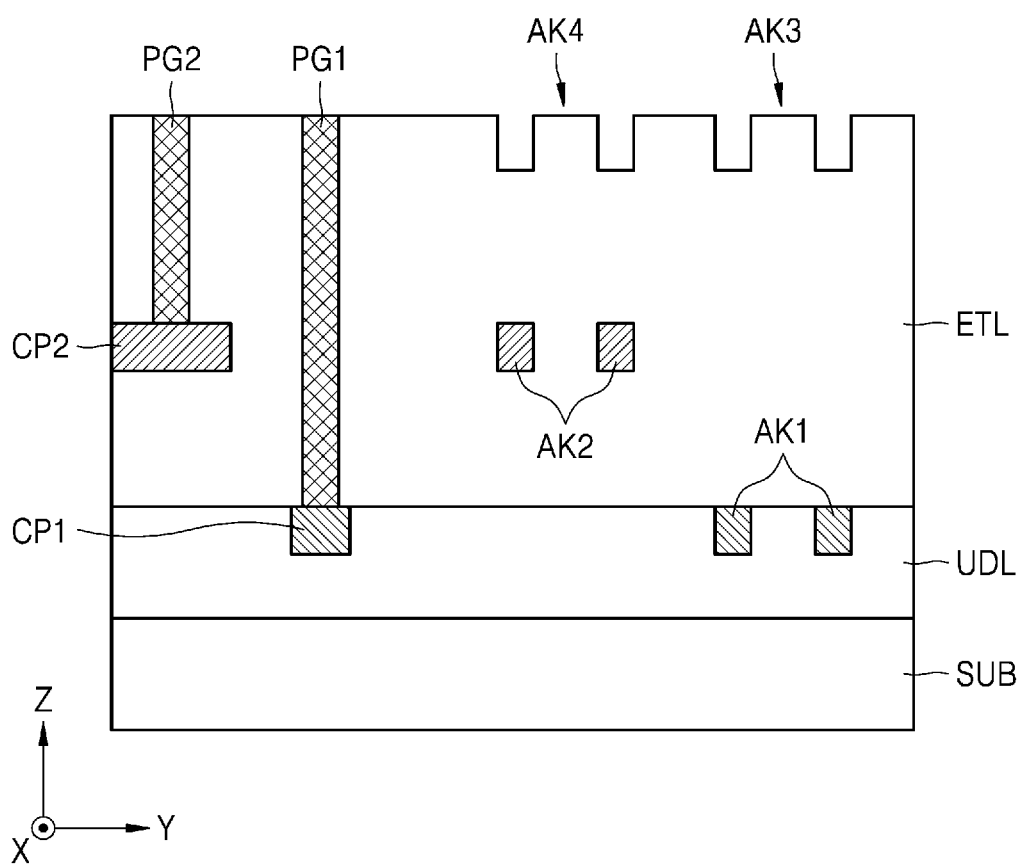

Referring to FIGS. 1, 11, and 12, in operation P200, first and second conductive plugs PG1 and PG2 may be formed.

Forming of the first and second conductive plugs PG1 and PG2 may include, depositing a conductive material having a good step coverage, such as tungsten (W), to fill the inner space of the first and second contact holes H1 and H2 and performing chemical-mechanical polishing (CMP) using a top surface of the etching target layer ETL as an end point.

According to example embodiments, before an etching process is performed on the key patterning material layer KPML and the etching target layer ETL, exposure and developing processes for forming the first and second alignment patterns AP1 and AP2 may be performed on the third layer KL3. According to example embodiments, each of the first alignment key AK1 and the second alignment key AK2 at different levels may be transferred to the upper portion of the etching target layer ETL through one etching process so that a third alignment key AK3 and a fourth alignment key AK4 may be formed. Thus, because the number of processes required for manufacturing of a semiconductor device is reduced, cost for manufacturing the semiconductor device may be reduced, and productivity may be enhanced.

Through the method described above with reference to FIGS. 1 through 12, a semiconductor device in which contact plugs having high aspect ratios with different vertical levels are simultaneously formed, may be manufactured. The semiconductor device may be an arbitrary memory device including a high aspect ratio structure, such as a vertical type NAND flash memory, resistive RAM (RRAM), phase change RAM (PRAM), magnetic RAM (MRAM), dynamic RAM (DRAM), but embodiments are not limited thereto.

Figure 13:
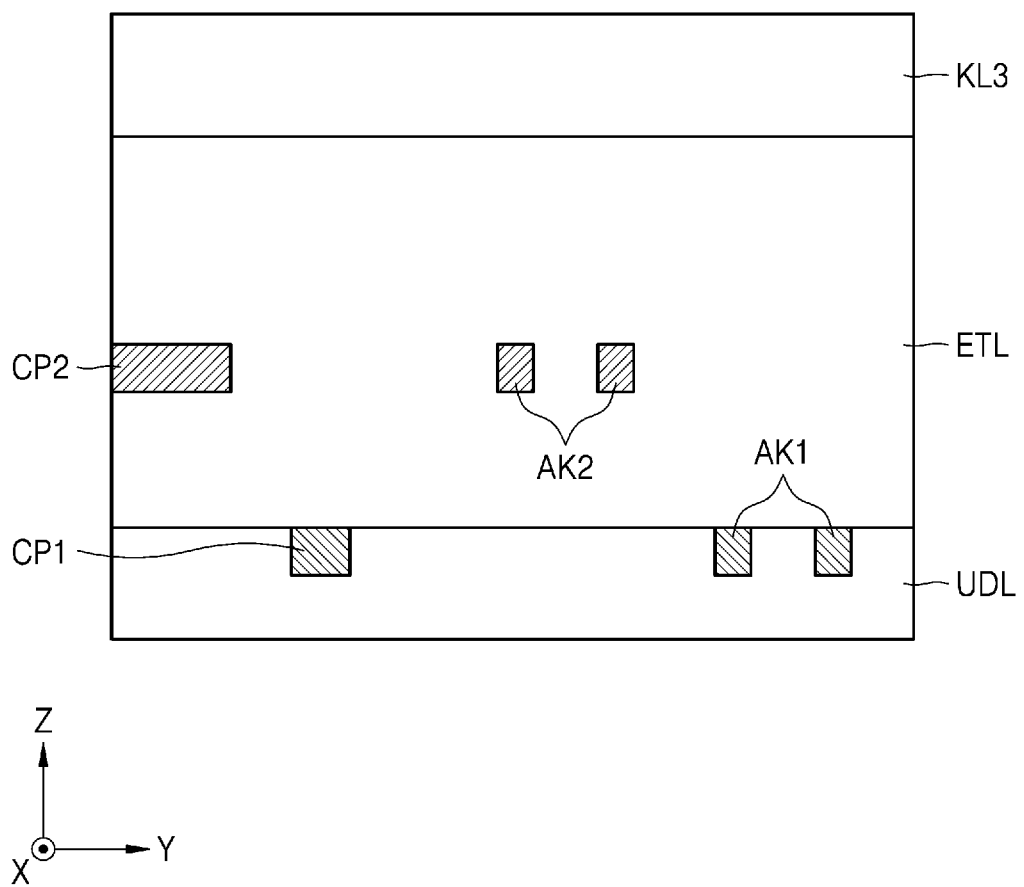
FIGS. 13 through 15 are cross-sectional views illustrating a method of manufacturing a semiconductor device, according to example embodiments.
Figure 14:
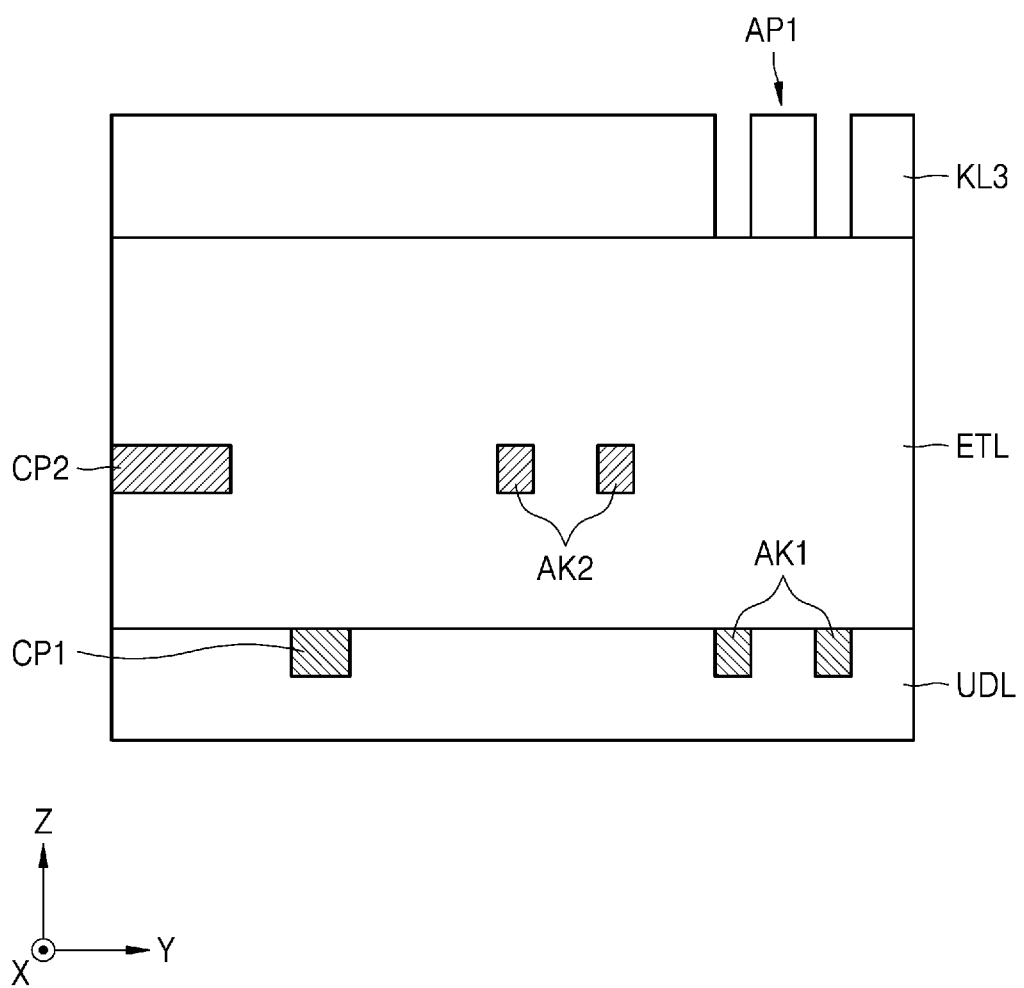
Figure 15:
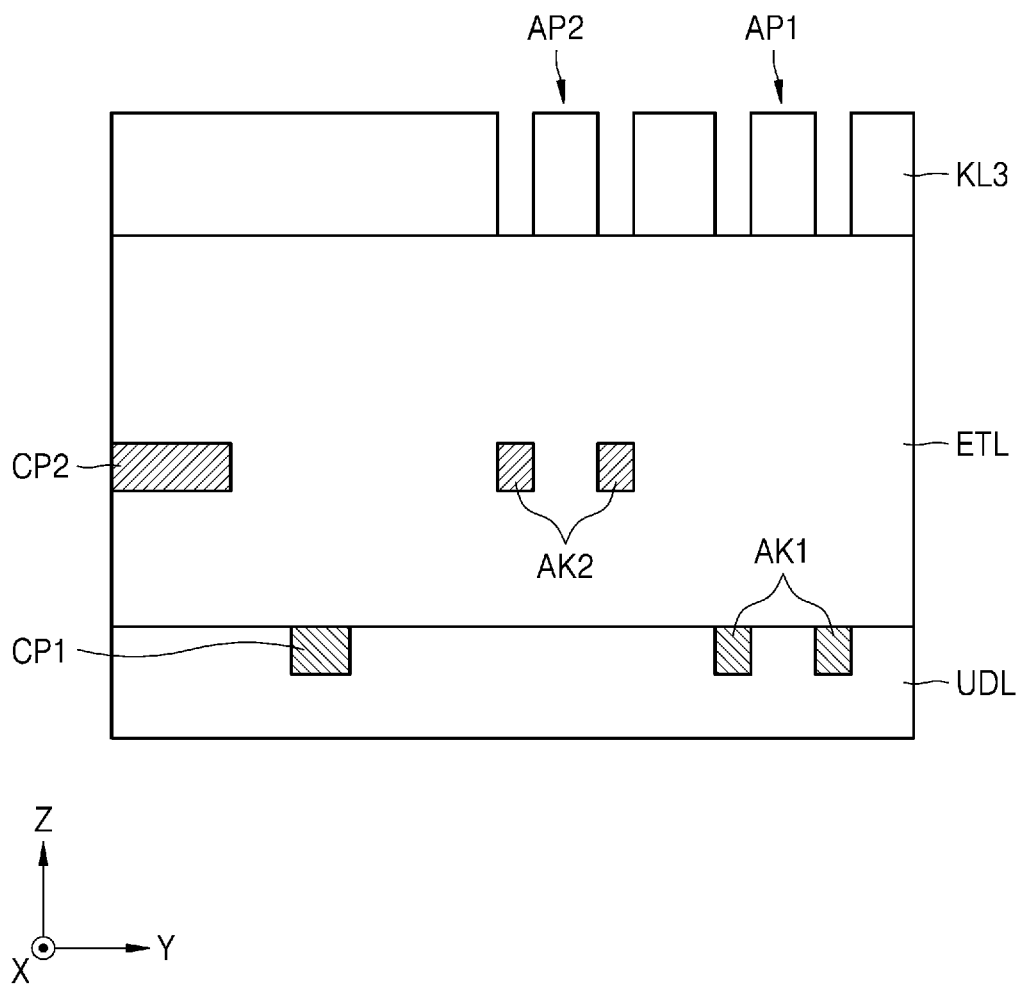

FIGS. 13 through 15 are cross-sectional views illustrating a method of manufacturing a semiconductor device, according to example embodiments.

For convenience of description, descriptions already given with reference to FIGS. 1 through 12 will be omitted, and differences will be mainly described.

In a semiconductor device manufacturing process, FIG. 13 corresponds to FIG. 3, FIG. 14 corresponds to FIG. 4, and FIG. 15 corresponds to FIG. 5.

Referring to FIG. 13, unlike in FIG. 3, a third layer KL3 including a photoresist material may be formed on an etching target layer ETL. Thus, the third layer KL3 may be in contact with the etching target layer ETL.

Subsequently, referring to FIG. 14, a first alignment pattern AP1 that overlaps a first alignment key AK1 in the Z-direction may be formed on the third layer KL3 through exposure and developing processes.

Subsequently, referring to FIG. 15, a second alignment pattern AP2 that overlaps a second alignment key AK2 in the Z-direction may be formed on the third layer KL3 through exposure and developing processes.

Subsequently, referring to FIGS. 15 and 6, an upper portion of the etching target layer ETL may be etched by using the third layer KL3 on which the first and second alignment patterns AP1 and AP2 are formed, as an etching mask so that third and fourth alignment keys AK3 and AK4 may be formed.

After the third and fourth alignment keys AK3 and AK4 are formed, the third layer KL3 may be removed. Subsequently, a subsequent process that is substantially the same as the description with reference to FIGS. 7 through 12 may be further performed.

Figure 16:
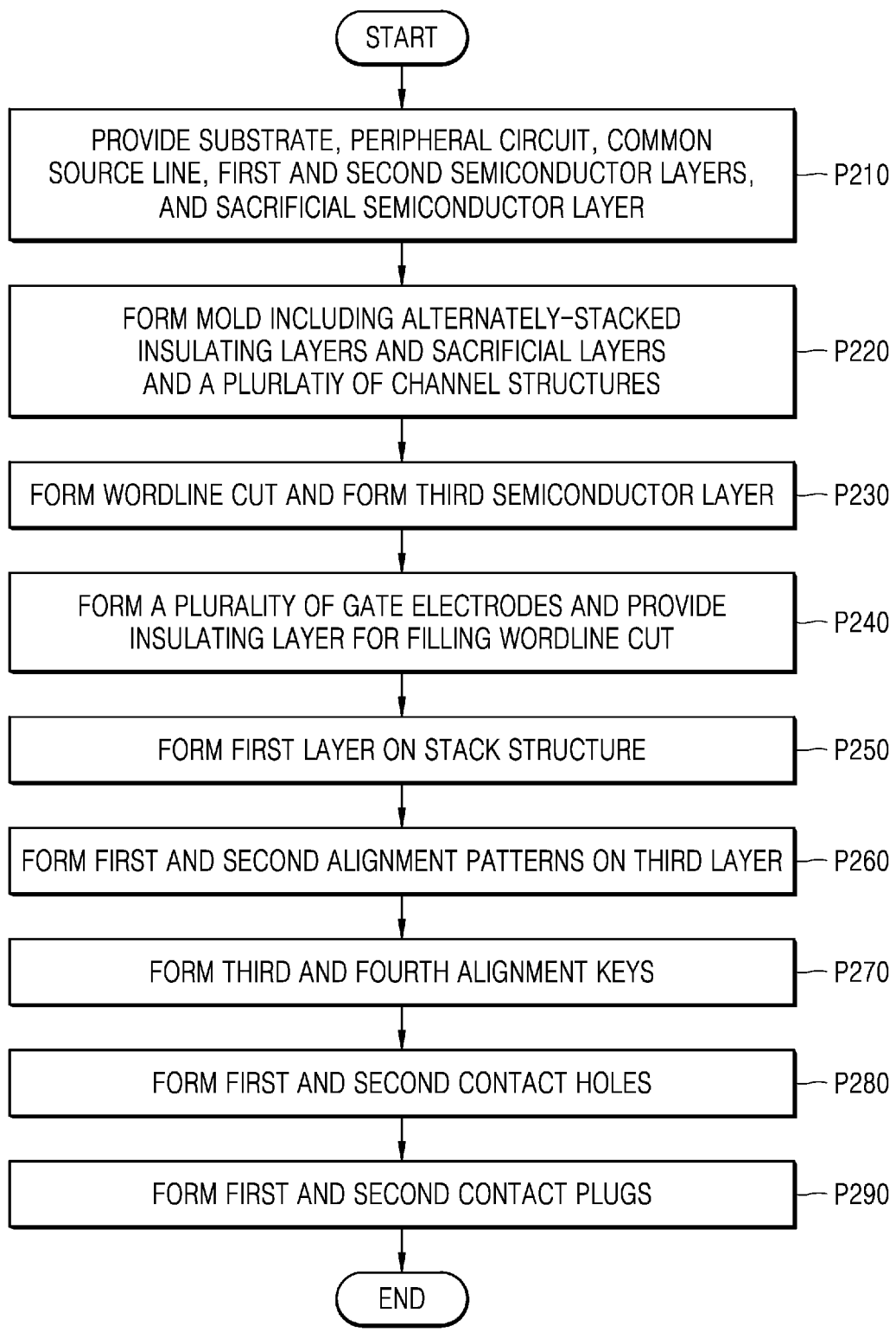
FIG. 16 is a flowchart illustrating a method of manufacturing a semiconductor device, according to some embodiments.

FIG. 16 is a flowchart illustrating a method of manufacturing a semiconductor device, according to some embodiments.

FIGS. 17 through 28 are cross-sectional views illustrating a method of manufacturing a semiconductor device, according to some embodiments.

Figure 17:
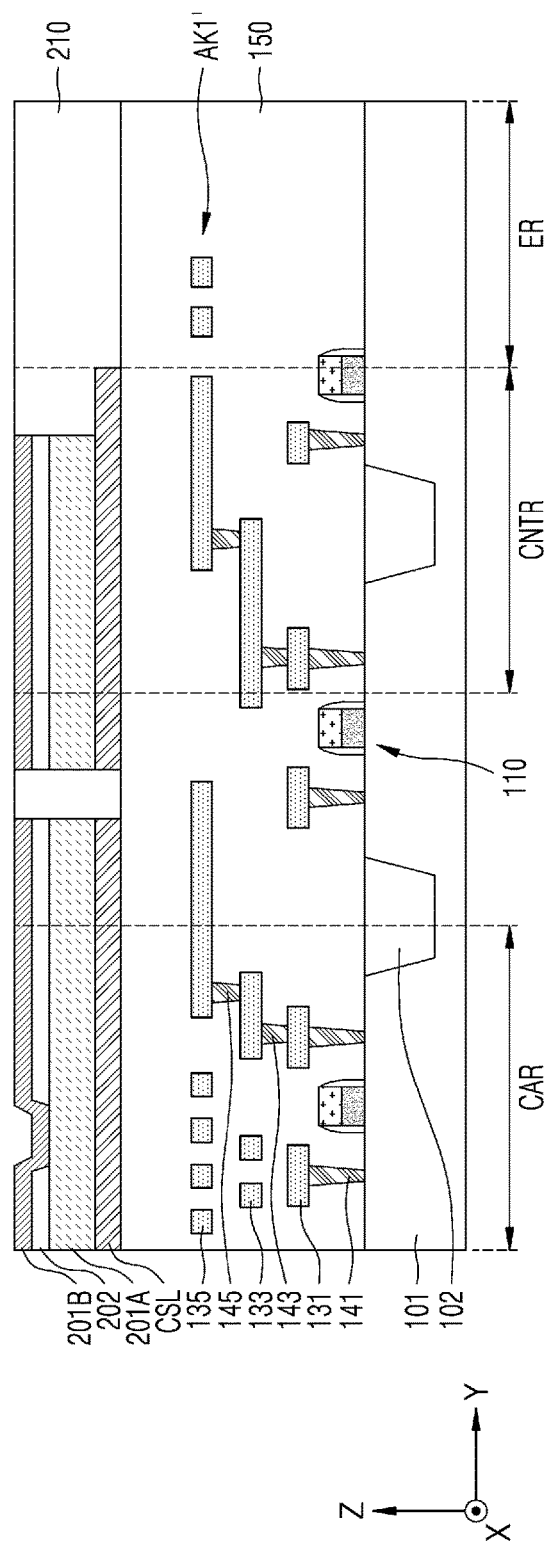
FIGS. 17 through 28 are cross-sectional views illustrating a method of manufacturing a semiconductor device, according to some embodiments.

Referring to FIGS. 16 and 17, in operation P210, a substrate 101, a peripheral circuit, a common source line plate CSL, first and second semiconductor layers 201A and 201B, and an intermediate sacrificial layer 202 may be provided.

A cell array region CAR in which memory cells are formed, a contact region CNTR, and an edge region ER for contacting a cell gate electrode may be defined on the substrate 101. The cell array region CAR may have approximately a rectangular layout, and the contact region CNTR may be formed on one end or both ends of the cell array region CAR, and the edge region ER may horizontally surround the contact region CNTR and the cell array region CAR.

Here, a direction perpendicular to a top surface of the substrate 101 will be defined as the Z-direction, and two directions that are parallel to the top surface of the substrate 101 and perpendicular to each other will be defined as the X-direction and the Y-direction, respectively.

Forming of the peripheral circuit may include a process of forming a device isolation layer 102 on the substrate 101, an ion implantation process for forming a p-well region and an n-well region on the substrate 101, a process of forming peripheral transistors 110, and a metallization process of forming a peripheral circuit interconnection.

According to some embodiments, the substrate 101 may be a semiconductor substrate including a semiconductor material such as monocrystalline silicon or monocrystalline germanium. A trench for defining an active region and an inactive region may be formed in the substrate 101, and the device isolation layer 102 may be formed to fill the trench.

The metallization process may be a process of patterning a conductive material and providing an insulating material to form a plurality of peripheral conductive patterns 131, 133, and 135 arranged at different levels, and peripheral conductive vias 141, 143, and 145 for connecting the peripheral conductive patterns 131, 133, and 135 arranged at different levels. Thus, lower peripheral transistors 110 and upper memory cells may be connected to one another.

According to example embodiments, a first alignment key AK1' may be formed simultaneously with the formation of the uppermost peripheral conductive patterns 135. The first alignment key AK1' may be formed at the same level as the peripheral conductive patterns 135. The first alignment key AK1' may be formed in the edge region ER.

According to some embodiments, a common source line plate CSL, a first semiconductor layer 201A, and a second semiconductor layer 201B may be formed on a peripheral circuit including peripheral transistors 110, peripheral conductive patterns 131, 133, and 135, and peripheral conductive vias 141, 143, and 145 for connecting the peripheral conductive patterns 131, 133, and 135 through a CVD process, an ALD process, or a physical vapor deposition (PVD) process based on polysilicon doped with impurities.

A sacrificial layer 202 including an insulating material may be provided on the first semiconductor layer 201A. According to some embodiments, the sacrificial layer 202 may include any one of silicon oxide, silicon nitride, and silicon oxynitride. According to some embodiments, the sacrificial layer 202 may have a high etching selectivity with respect to insulating layers (e.g., sacrificial layers 230 of FIG. 18) to be described below.

Subsequently, after a portion of the sacrificial layer 202 is removed by patterning, a second semiconductor layer 201B may be conformally provided. Thus, a first semiconductor layer 201A may be in contact with a second semiconductor layer 201B at a portion from which the sacrificial layer 202 has been removed. The term "contact," as used herein, refers to a direction connection (i.e., touching) unless the context indicates otherwise.

Subsequently, an intermediate insulating layer 210 may be formed. Forming of the intermediate insulating layer 210 may include etching the common source line plate CSL, the first semiconductor layer 201A, the sacrificial layer 202, and the second semiconductor layer 201B so that the top surface of the lower insulating layer 150 is exposed, providing an insulating material sufficient to fill an opening formed by etching, and performing a planarization process so that the top surface of the second semiconductor layer 201B is exposed. According to some embodiments, the intermediate insulating layer 210 may include silicon oxide, silicon nitride, silicon oxynitride, and the like, but is not limited thereto.

Figure 18:
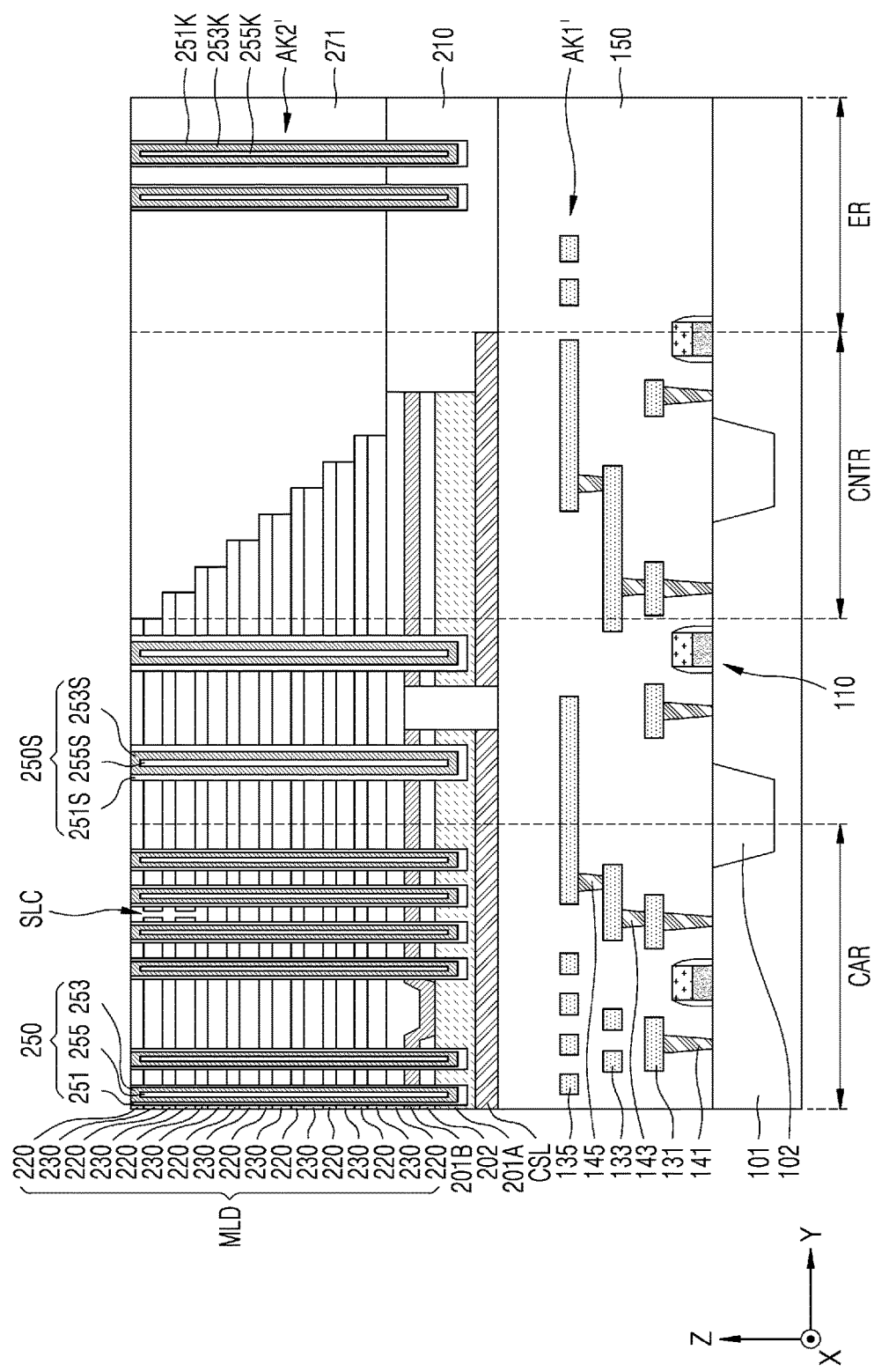

Referring to FIGS. 16 and 18, in operation P220, a mold including insulating layers 220 and sacrificial layers 230 that are alternately stacked, and a plurality of channel structures 250, vertical type support structures 250S, and a second alignment key AK2' may be formed.

The mold MLD may include the insulating layers 220 and the sacrificial layers 230, which are alternately stacked. According to some embodiments, the insulating layers 220 and the sacrificial layers 230 may include different materials. According to some embodiments, the insulating layers 220 and the sacrificial layers 230 may include high etching selectivities. For example, when the insulating layers 220 include silicon oxide, the sacrificial layers 230 may include undoped polysilicon or silicon nitride. In another example, when the insulating layers 220 include silicon nitride, the sacrificial layers 230 may include undoped polysilicon or silicon oxide. For example, when the insulating layers 220 include undoped polysilicon, the sacrificial layers 230 may include silicon nitride or silicon oxide. A plurality of insulating layers 220 and sacrificial layers 230 included in the mold MLD may constitute a stepped structure on the contact region CNTR. The stepped structure may be a structure in which the sacrificial layers 230 closer to the substrate 101 protrude further outwardly (e.g., toward the edge region ER) than the sacrificial layers 230 more distant from the substrate 101 and the insulating layers 220 closer to the substrate 101 protrude further outwardly (e.g., toward the edge region ER) than the insulating layers 220 more distant from the substrate 101.

According to some embodiments, a string selection line cut SLC for horizontally separating the sacrificial layers 230 of the uppermost layer and a layer immediately below the uppermost layer may be formed, and a space recessed by the formation of the string selection line cut SLC may be filled with an insulating material.

According to some embodiments, a first upper insulating layer 271 for covering the stepped structure of the mold MLD may be formed. The first upper insulating layer 271 may include an insulating material.

Subsequently, after a photoresist layer and a hard mask layer are provided on the mold MLD through a lithography process, a plurality of holes may be formed by using the photoresist layer and the hard mask layer as an etching mask. The plurality of holes may extend to the first semiconductor layer 201A. Subsequently, after a gate insulating material layer, a channel material layer, and a buried insulating material layer are sequentially provided, an etch back process may be performed so that the top surface of the first upper insulating layer 271 is exposed, and thus material layers for filling the holes may be separated from each other. Subsequently, after the upper portion of the buried insulating material layer in the holes is further removed, the same material as the channel material layer may be deposited. Thus, a channel layer 253 may cover the top surface of the buried insulating layer 255, a support channel layer 253S may cover the top surface of a support buried insulating layer 255S, and a key channel layer 253K may cover the top surface of a key buried insulating layer 255K. Thus, pads for contact with second conductive vias (e.g., second conductive vias 287 of FIG. 26) to be described below may be formed.

According to some embodiments, a gate insulating layer 251, a support gate insulating layer 251S, and a key gate insulating layer 251K each may have a conformal thickness. According to some embodiments, the gate insulating layer 251 may constitute the bottom surface and the outer surface of a channel structure 250, the support gate insulating layer 251S may constitute the bottom surface and the outer surface of the support structure 250S, and the key gate insulating layer 251K may constitute the bottom surface and the outer surface of the second alignment key AK2'. According to some embodiments, the gate insulating layer 251 may insulate the channel layer 253 from gate electrodes 240.

According to some embodiments, each of the gate insulating layer 251, the support gate insulating layer 251S, and the key gate insulating layer 251K each may include a plurality of layers having a conformal thickness. According to some embodiments, each of the gate insulating layer 251, the support gate insulating layer 251S, and the key gate insulating layer 251K may include a tunnel insulating layer, a charge storage layer, and a blocking insulating layer. In some cases, a barrier metal layer may be further arranged between the gate insulating layer 251 and the gate electrodes 240. The tunnel insulating layer may include silicon oxide, hafnium oxide, aluminum oxide, zirconium oxide, and tantalum oxide. The charge storage layer may be a region in which electrons tunneled from the channel layer 253 are stored, and may include silicon nitride, boron nitride, silicon boron nitride, or polysilicon doped with impurities. The blocking insulating layer may include a single layer such as silicon oxide, silicon nitride, hafnium oxide, aluminum oxide, zirconium oxide, tantalum oxide, or the like, or a stack layer thereof. However, a material for the blocking insulating layer is not limited thereto, and the blocking insulating layer may include a dielectric material having a high dielectric constant value.

According to some embodiments, the channel layer 253 may fill a part of a space defined by the gate insulating layer 251. The channel layer 253 formed on an inner sidewall of the gate insulating layer 251 may have a conformal thickness. According to some embodiments, the upper portion of the channel layer 253 may have a larger thickness than the sidewall of the channel layer 253. The support channel layer 253S and the key channel layer 253K may also have a similar cross-sectional shape to the channel layer 253.

The gate insulating layer 251, the channel layer 253, and the buried insulating layer 255 may constitute the channel structure 250, the support gate insulating layer 251S, the support channel layer 253S, and the support buried insulating layer 255S may constitute a support channel structure 250S, and the key gate insulating layer 251K, the key channel layer 253K, and the key buried insulating layer 255K may constitute the second alignment key AK2'. The shape of the top surface of the second alignment key AK2' may be a hollow rectangular shape, but is not limited thereto.

According to example embodiments, the channel structure 250 and the support structure 250S may have a cylindrical shape with a height extending in the Z-direction. According to example embodiments, the channel structure 250 may have a tapered structure with a narrow width towards the substrate 101 in the Z-direction.

Figure 19:
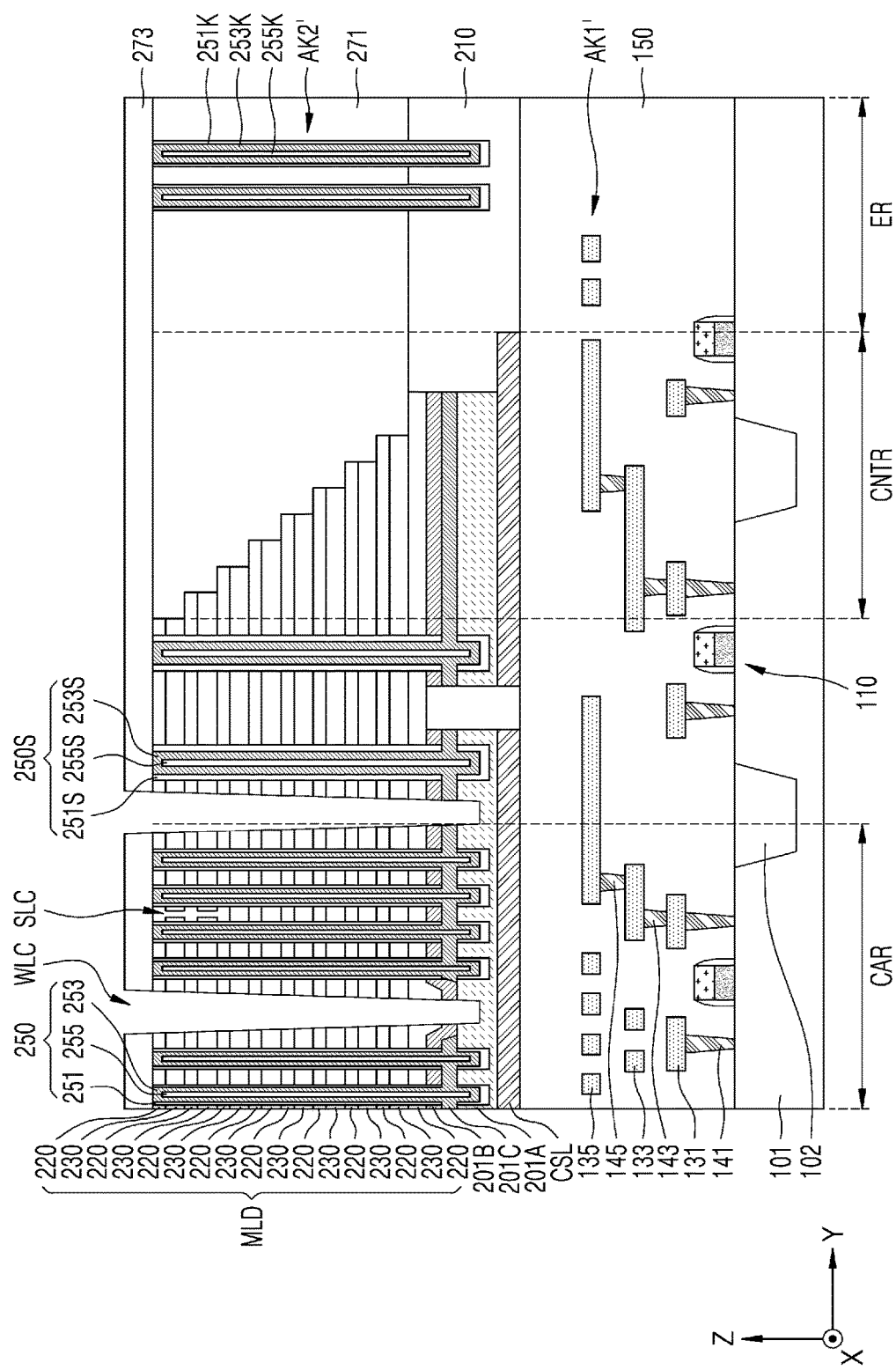

Referring to FIGS. 16 and 19, in operation P230, a wordline cut WLC may be formed, and a third semiconductor layer 201C may be formed.

Before the wordline cut WLC is formed, a second upper insulating layer 273 for covering the mold MLD and the first upper insulating layer 271 may be provided. The formation of the wordline cut WLC may be performed through a lithography process and a dry etching process, for example. Portions of the mold MLD may be horizontally separated from each other through the formation of the wordline cut WLC.

In order to form the third semiconductor layer 201C, after a liner is provided onto the wordline cut WLC, a portion at the same level as a lower portion of a liner (e.g., an intermediate sacrificial layer (e.g., intermediate sacrificial layer 202 of FIG. 18)) is removed, so that an intermediate sacrificial layer (e.g., intermediate sacrificial layer 202 of FIG. 18) may be exposed. According to some embodiments, the liner formed on the wordline cut WLC may include a material having a high etching selectivity with respect to the intermediate sacrificial layer (e.g., intermediate sacrificial layer 202 of FIG. 18). The liner may be a layer for protecting the sacrificial layers 230 on the mold MLD in a process of removing the intermediate sacrificial layer (e.g., intermediate sacrificial layer 202 of FIG. 18). Subsequently, the intermediate sacrificial layer (e.g., intermediate sacrificial layer 202 of FIG. 18) may be removed through a wet etching process.

Even when the intermediate sacrificial layer (e.g., intermediate sacrificial layer 202 of FIG. 18) is removed, because the first semiconductor layer 201A and the second semiconductor layer 201B are partially in contact with each other, the first and third upper substrate layers 201A and 201C and the mold MLD thereon may be prevented from collapsing.

As described above, the third semiconductor layer 201C may be polysilicon doped with substantially the same concentration by using the same dopant as the first and second semiconductor layers 201A and 201B. Because a portion of the gate insulating layer 251 is removed together with the intermediate sacrificial layer (e.g., intermediate sacrificial layer 202 of FIG. 18), the third semiconductor layer 201C and the channel layer 253 may be in contact with each other. Thus, a charge movement path for the channel structures 250 to operate as memory cells may be formed. After the third semiconductor layer 201C is formed, the liner may be removed.

Figure 20:
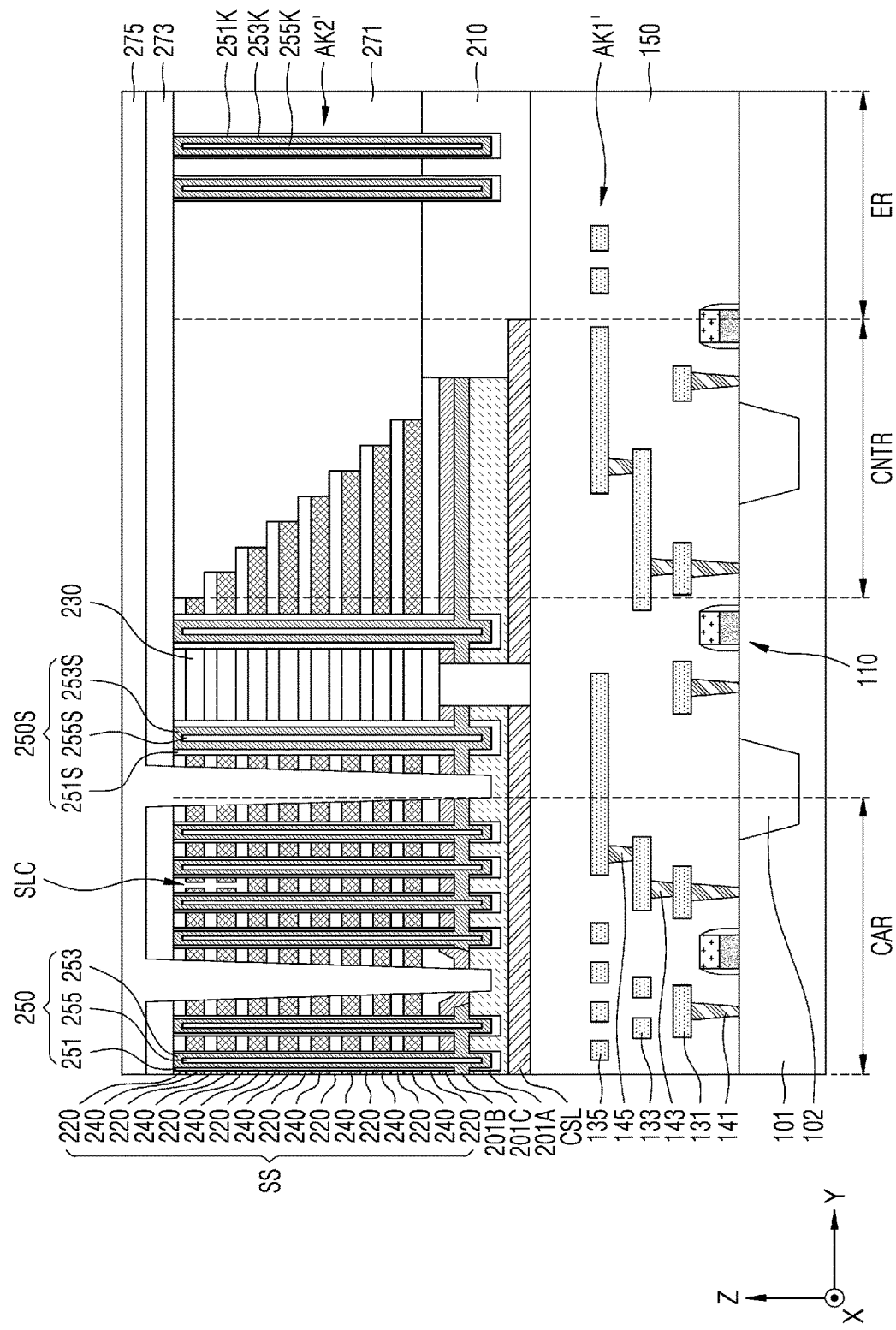

Subsequently, referring to FIGS. 8, 19, and 20, in operation P240, a plurality of gate electrodes 240 are formed and a third upper insulating layer 275 that fills the wordline cut WLC may be provided.

According to some embodiments, because the sacrificial layers 230 have high etching selectivity with respect to the insulating layers 220 and the first through third upper substrate layers 201A, 201B, and 201C, the sacrificial layers 230 may be removed through isotropic etching such as wet etching. In this case, the sacrificial layers 230 that are portions apart from the wordline cut WLC by a set distance may not be removed.

According to some embodiments, after a conductive material is sufficiently provided to fill a space from which the sacrificial layers 230 are removed, the conductive material formed inside the wordline cut WLC may be removed through isotropic etching such as wet etching. Thus, a stack structure SS including the plurality of gate electrodes 240 and the plurality of insulating layers 220 therebetween may be provided.

According to example embodiments, the plurality of different gate electrodes 240 arranged at the same vertical level may be separated from the substrate 101 by the wordline cut WLC. In addition, the gate electrodes 240 of the uppermost layer and a layer immediately below the uppermost layer may be separated from each other by the string selection line cut SLC.

Subsequently, a second upper insulating layer 273 that fills the wordline cut WLC and covers the first upper insulating layer 271 may be provided. According to example embodiments, while the gate electrodes 240 at different vertical levels are separated from each other, the gate electrodes 240 may be recessed in a lateral direction, and the third upper insulating layer 275 may fill the recessed portion of the gate electrodes 240.

Figure 21:
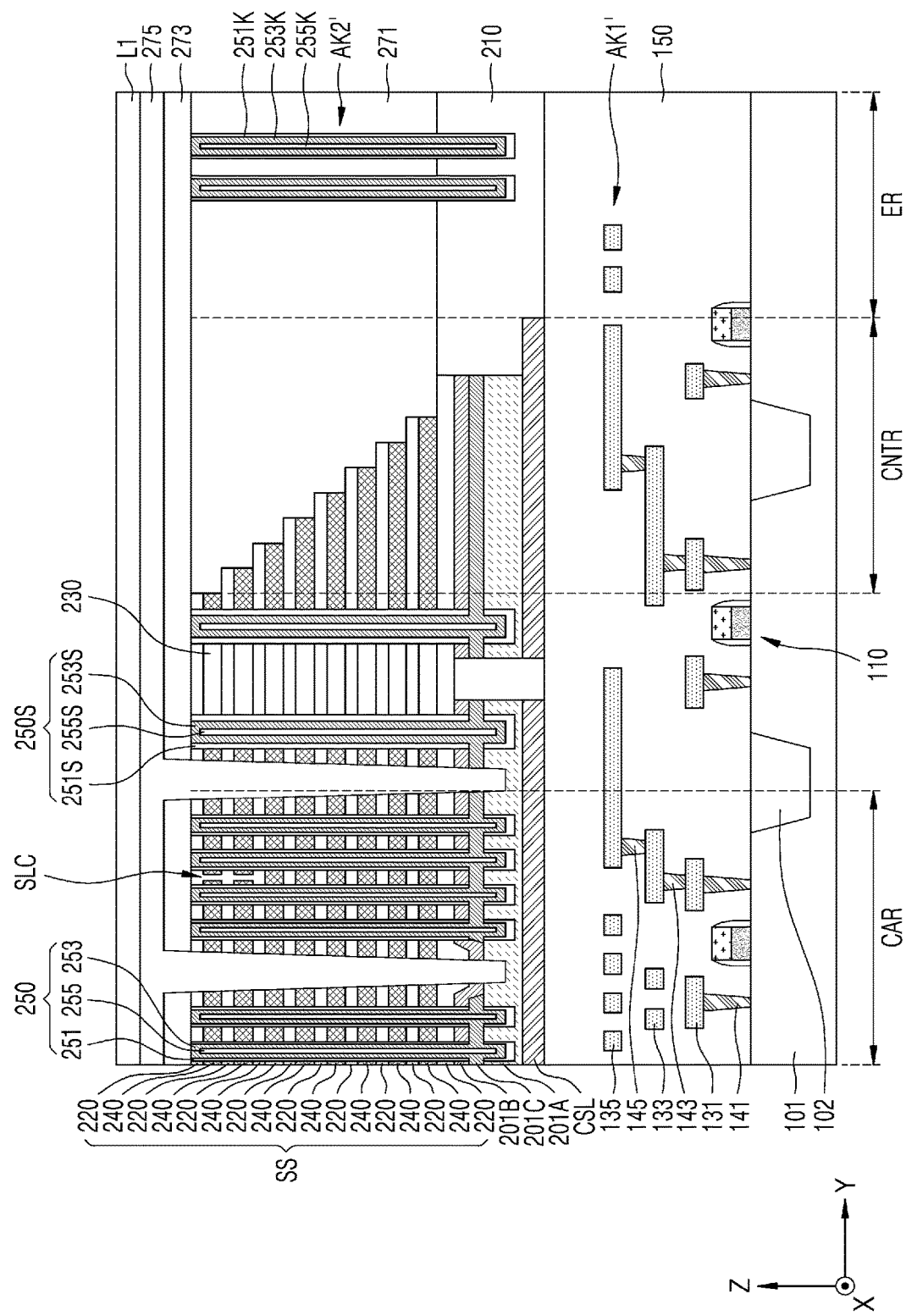

Subsequently, referring to FIGS. 16 and 21, in operation P250, a first layer L1 may be provided onto the stack structure SS.

The first layer L1 may be in contact with the third upper insulating layer 275. The first layer L1 may correspond to the third layer KL3 of FIG. 13. The first layer L1 may include a photoresist.

Figure 22:
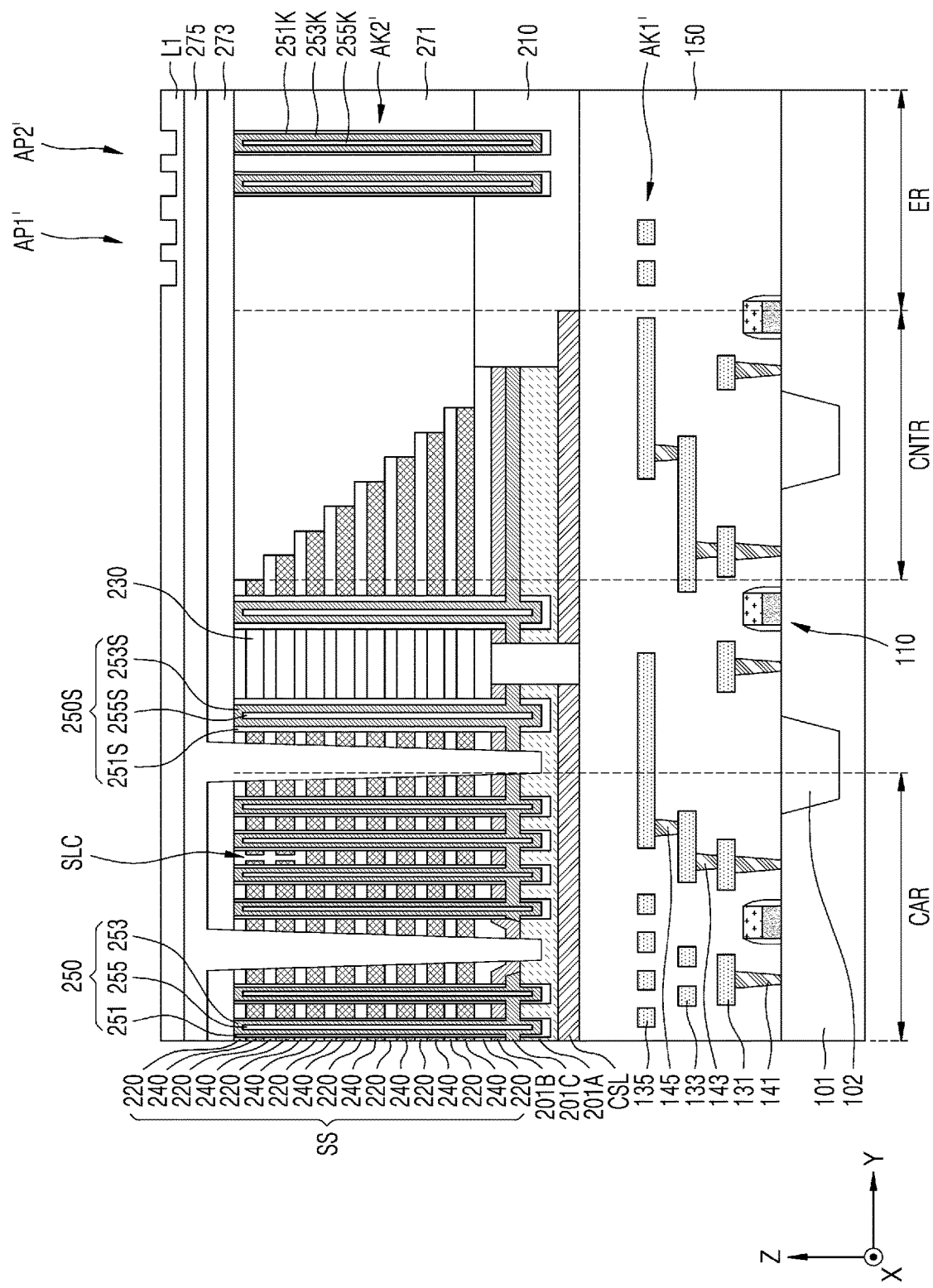

Subsequently, referring to FIGS. 16 and 22, in operation P260, first and second alignment patterns AP1' and AP2' may be formed on the first layer L1.

The first alignment pattern AP1' may be formed through a first exposure process and a first developing process based on the first alignment key AK1', and the second alignment pattern AP2' may be formed through a second exposure process and a second developing process based on the second alignment key AK2'. The formation of the first and second alignment patterns AP1' and AP2' is similar to the formation of the first and second alignment patterns AP1 and AP2 described with reference to FIGS. 1, 4, and 5.

Figure 23:
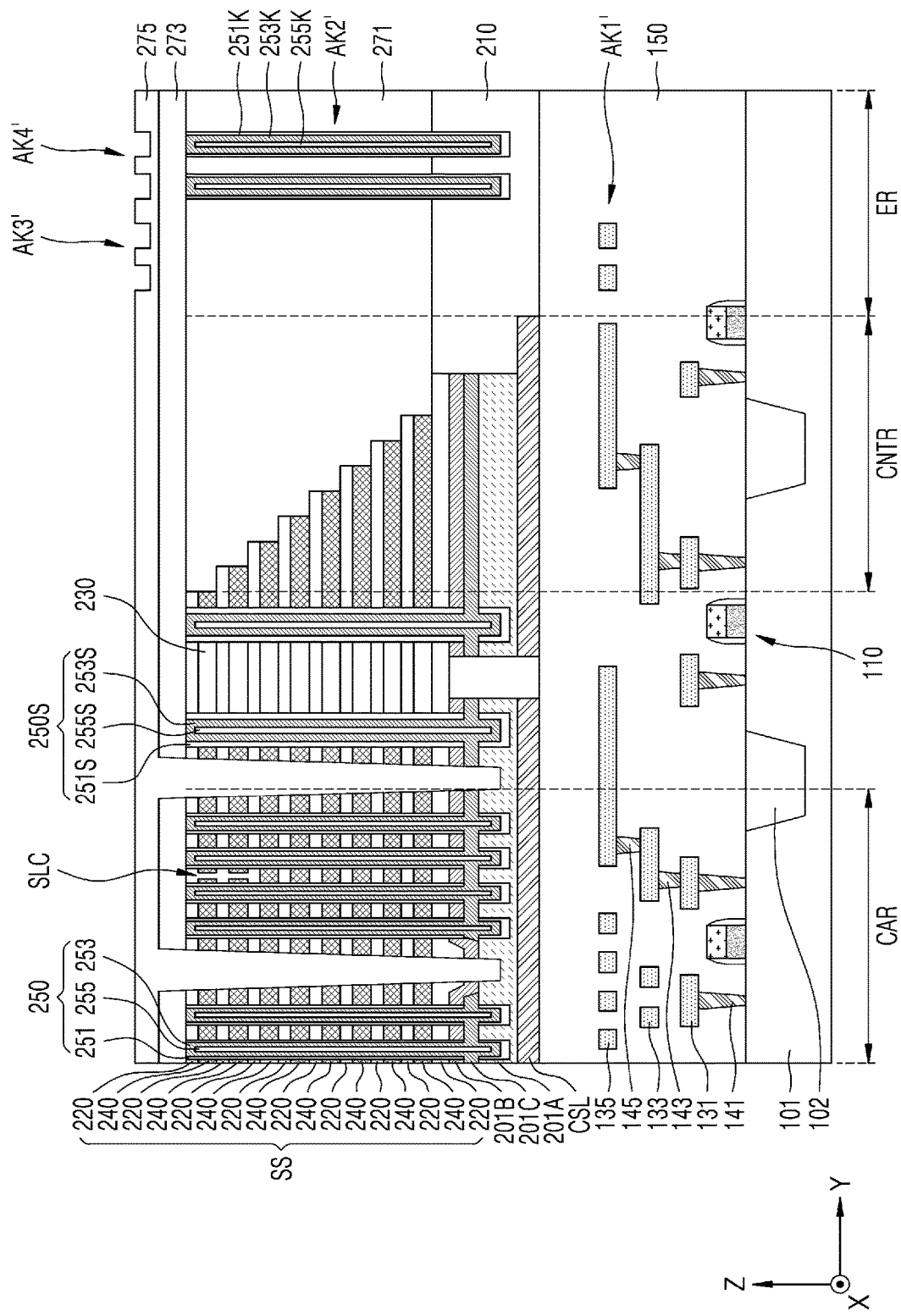

Subsequently, referring to FIGS. 16, 22, and 23, in operation P270, third and fourth alignment keys AK3' and AK4' may be formed.

The third upper insulating layer 275 may be etched by using the first layer L1 on which the first and second alignment patterns AP1' and AP2' are formed, as an etching mask so that third and fourth alignment keys AK3' and AK4' may be formed. The formation of the third and fourth alignment keys AK3' and AK4' is substantially the same as the formation of the third and fourth alignment keys AK3 and AK4 described with reference to FIGS. 1, 5, and 6.

Subsequently, referring to FIG. 16 and FIGS. 24 through 27, in operation P280, first and second contact holes H1' and H2' may be formed.

Figure 24:
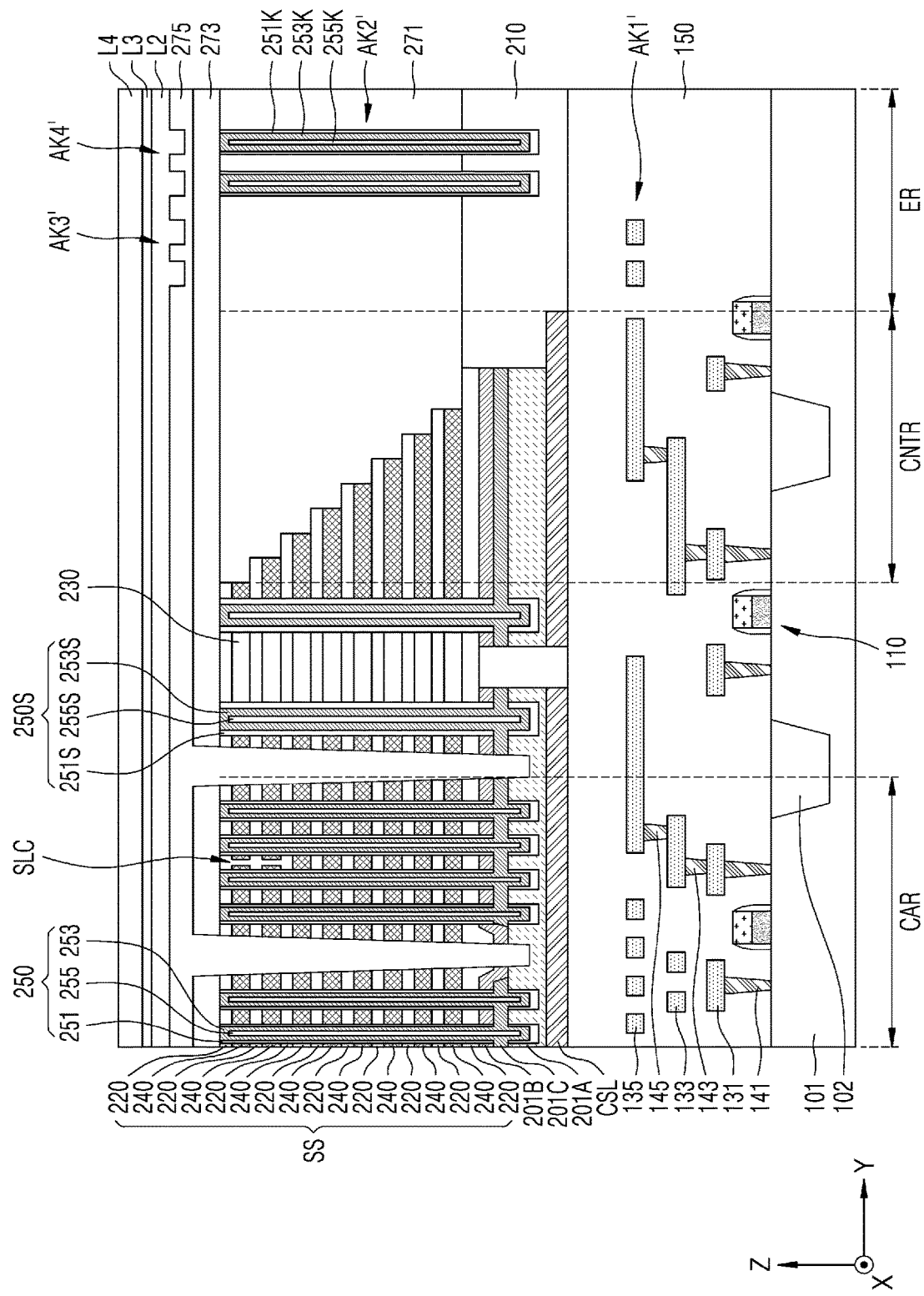

More specifically, referring to FIG. 24, second through fourth layers L2, L3, and L4 may be sequentially stacked on the third upper insulating layer 275. The second through fourth layers L2, L3, ad L4 may correspond to the first through third layers ML1, ML2, and ML3 of FIG. 7, respectively, in order. The second layer L2 may include amorphous carbon, and the third layer L3 may include silicon oxynitride, and the fourth layer L4 may include photoresist. The second layer L2 may be formed through a high-temperature CVD process compared to the first layer (e.g., first layer L1 of FIG. 21). Thus, the second layer L2 may have a relatively high etch rate and a relatively low transmittance.

Figure 25:
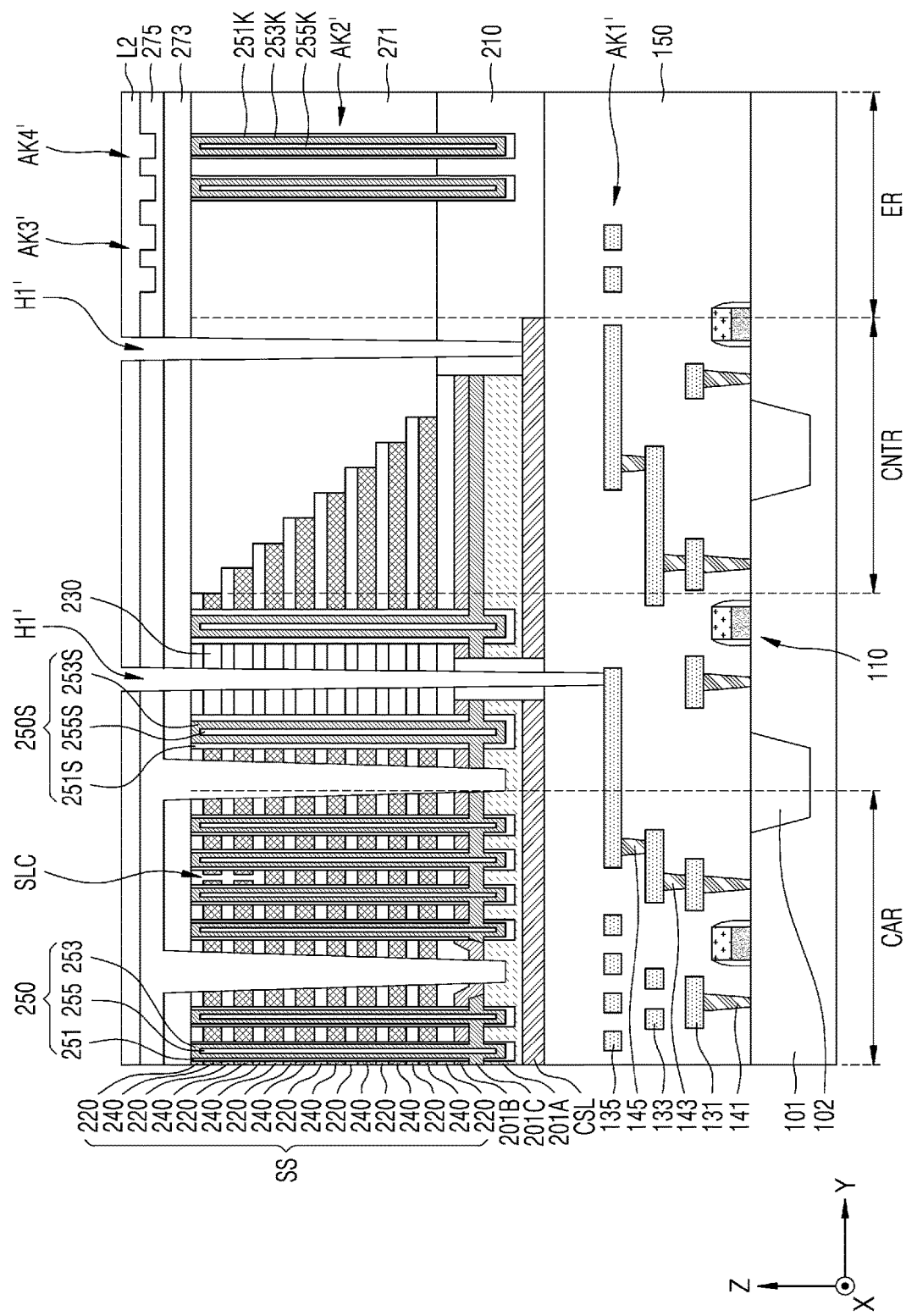

Subsequently, referring to FIG. 25, first contact holes H1' may be formed. The formation of the first contact holes H1' is similar to the formation of the first contact hole H1 described with reference to FIGS. 7 through 9. More specifically, the first contact holes H1' may be formed through a lithography process and an anisotropic etching process based on the third alignment key AK3'. During an etching process for forming the first contact holes H1', the third and fourth layers L3 and L4 and an upper portion of the second layer L2 may be removed. After the first contact holes H1' are formed, the second layer L2 may be removed.

Figure 26:
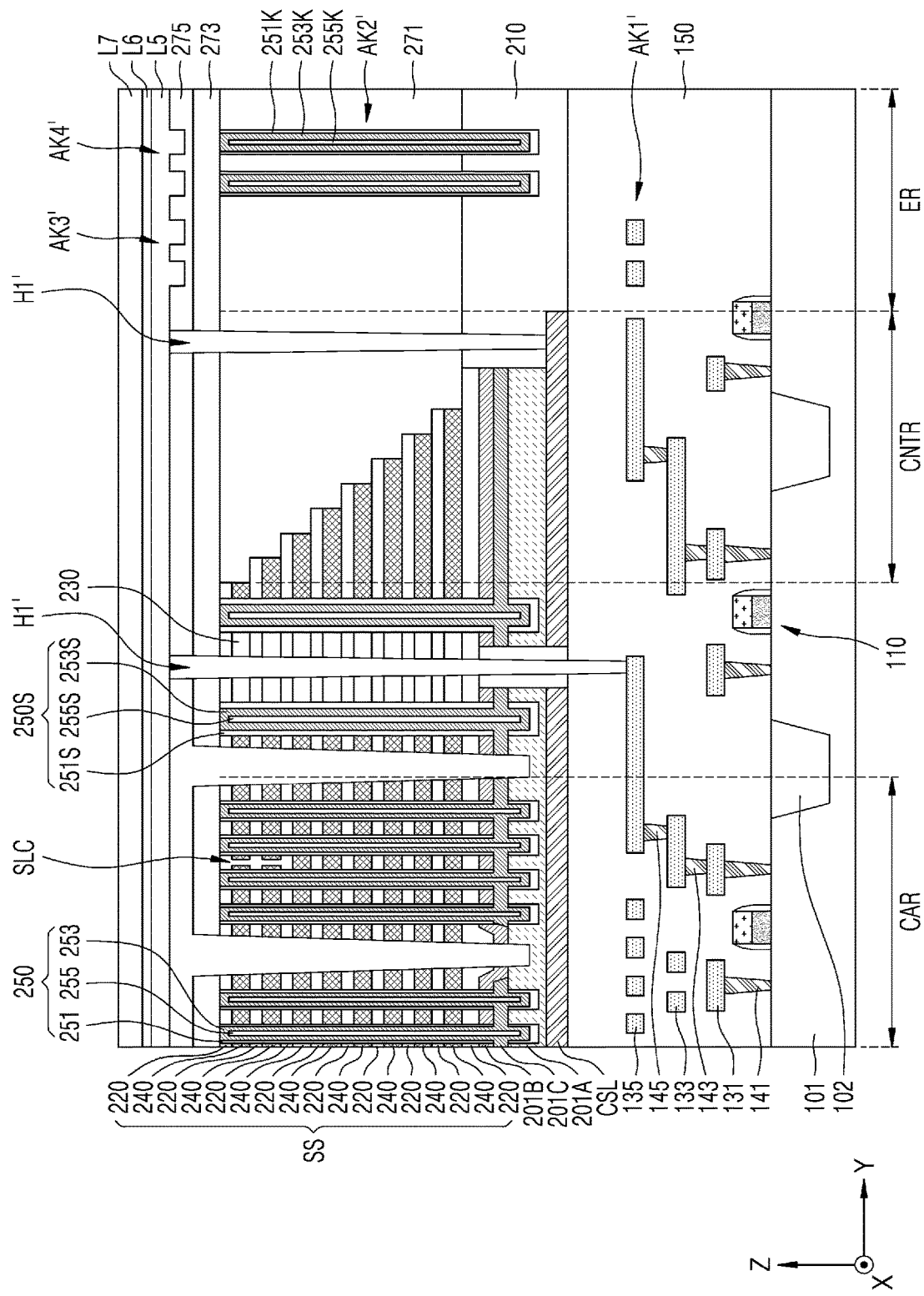

Subsequently, referring to FIG. 26, fifth through seventh layers L5, L6, and L7 may be sequentially stacked on the third upper insulating layer 275. The fifth through seventh layers L5, L6, and L7 may correspond to the fourth through sixth layers ML4, ML5, and ML6, respectively, in order. The fifth layer L5 may include amorphous carbon, the sixth layer L6 may include silicon oxynitride, and the seventh layer L7 may include photoresist. The fifth layer L5 may be formed through a high-temperature CVD process compared to the first layer (e.g., first layer L1 of FIG. 21). Thus, the fifth layer L5 may have a high etch rate and a low transmittance.

Figure 27:
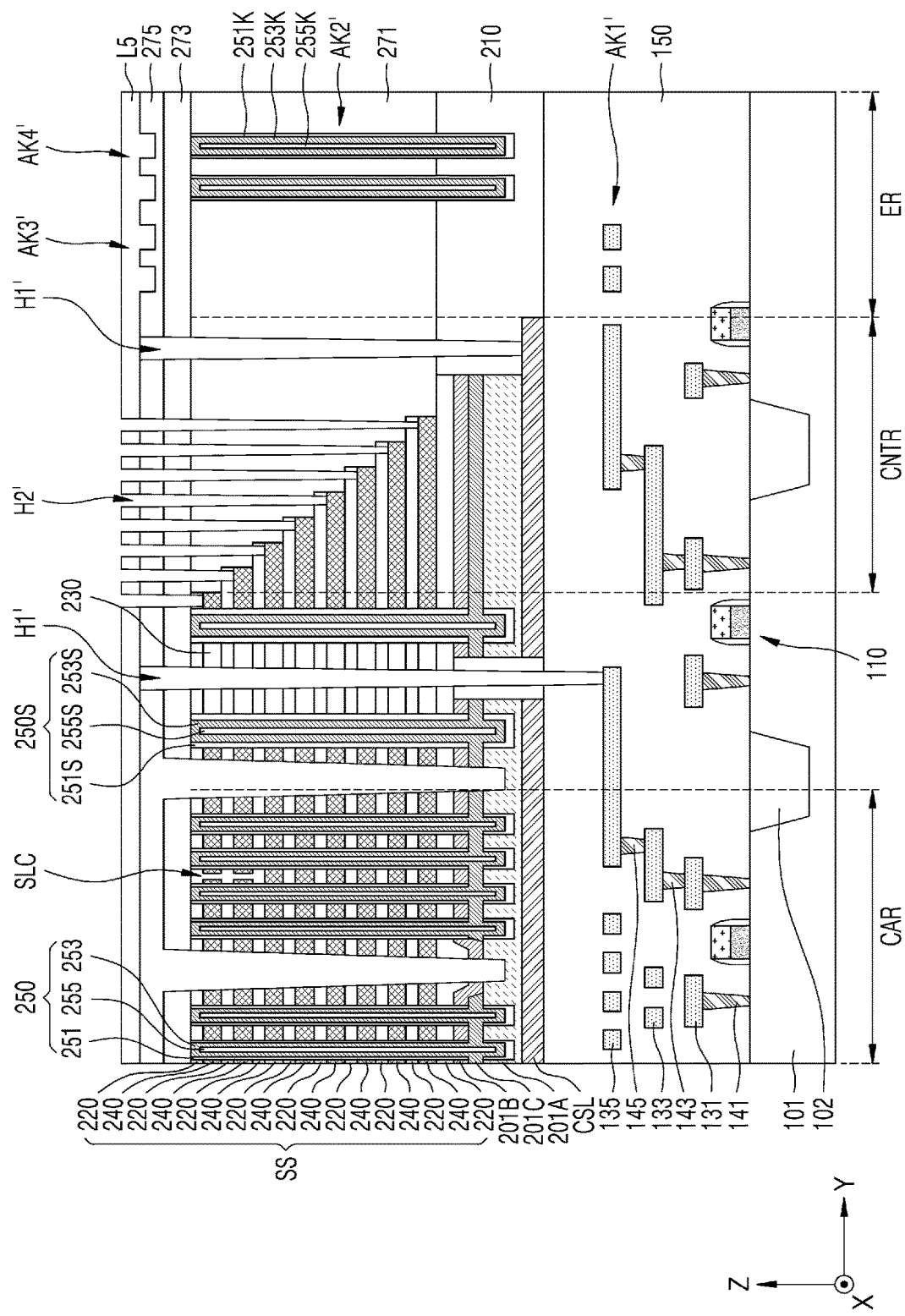

Subsequently, referring to FIG. 27, second contact holes H2' may be formed. The formation of the second contact holes H2' is similar to the formation of the second contact holes H2 described with reference to FIGS. 10 and 11. More specifically, the second contact holes H2' may be formed through a lithography process and an anisotropic etching process based on the fourth alignment key AK4'. During an etching process for forming the second contact holes H2', of the sixth and seventh layers L6 and L7 and an upper portion of the fifth layer L5 may be removed. After the second contact holes H2' are formed, the fifth layer L5 may be removed.

The first contact holes H1' may expose any one of the top surface of the common source line plate CSL and the upper surface of the peripheral conductive pattern 135. Each of the second contact holes H2' may expose the upper surface of the gate electrodes 240 on the contact region CNTR.

Figure 28:
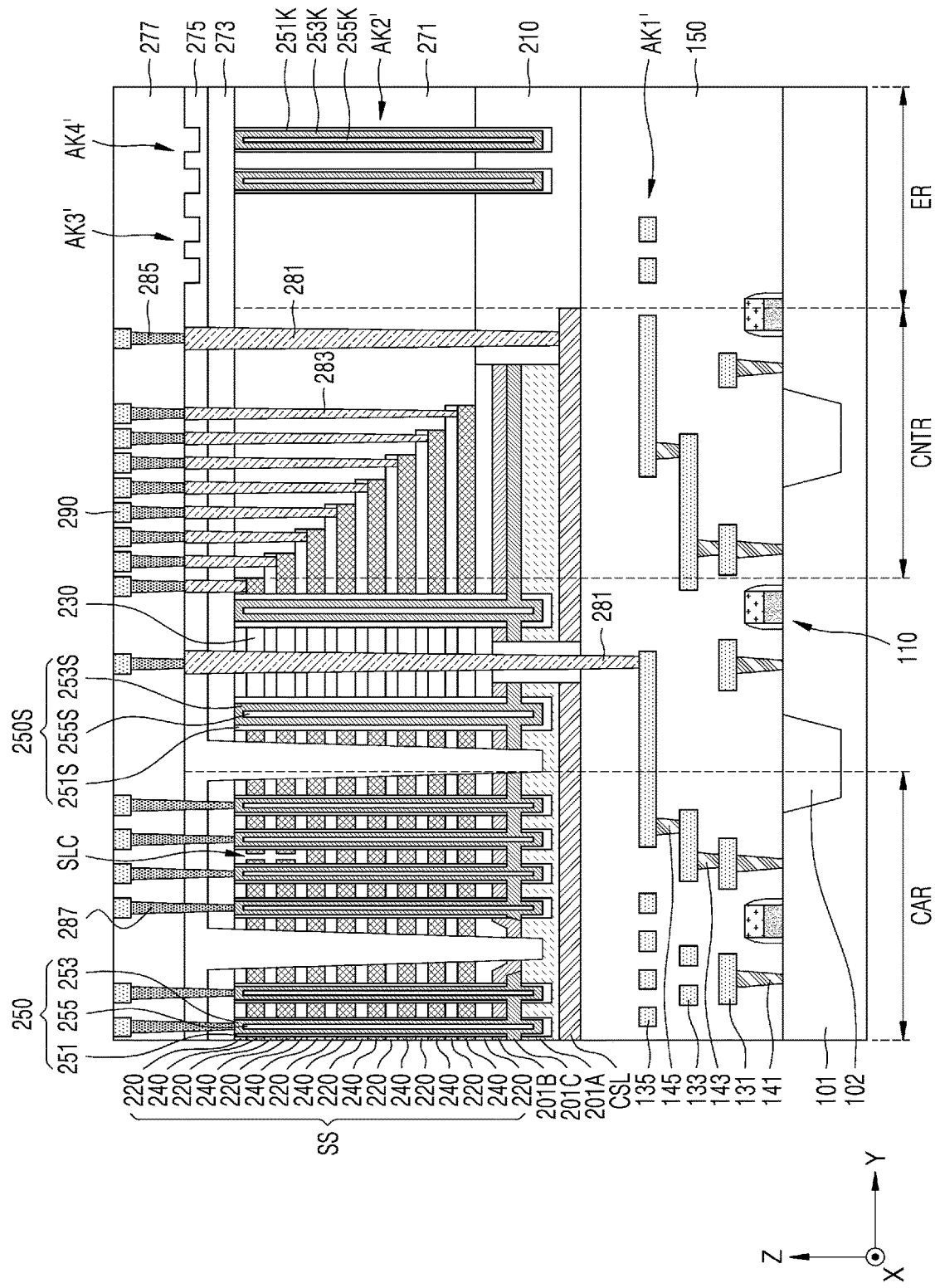

Subsequently, referring to FIGS. 16, 27, and 28, in operation P290, first and second contact plugs 281 and 283 may be formed.

The first contact plugs 281 may be formed within the first contact holes H1'. Some of the first contact plugs 281 may be in contact with the top surface of the common source line plate CSL, and some of the first contact plugs 281 may be in contact with the top surface of the peripheral conductive pattern 135. Each of the second contact plugs 283 may be in contact with the top surface of each of the gate electrodes 240 arranged at different levels.

Similarly to the description with reference to FIG. 12, the first and second contact plugs 281 and 283 may be formed by depositing a conductive material having a good step coverage, such as W, and performing a planarization process to separate the conductive material in the different contact holes H1' and H2'.

Subsequently, after a fourth upper insulating layer 277 is provided onto the first and second contact plugs 281 and 283 and the third upper insulating layer 275, an additional interconnection process may be performed. Thus, first conductive vias 285 connected to the first and second contact plugs 281 and 283, second conductive vias 287 connected to the channel structure 250, and conductive patterns 290 formed on the first and second conductive vias 285 and 287 may be provided.

Here, the conductive patterns 290 connected to the channel structure 250 may be bit lines, and the conductive patterns 290 connected to the gate electrode 240 may be wordlines.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor device, the method comprising:
   forming an etching target layer on a substrate;
   forming a first photoresist layer on the etching target layer;
   forming a first alignment key under the first photoresist layer and a first alignment pattern aligned in a first direction perpendicular to a top surface of the substrate, by exposing and developing the first photoresist layer;
   forming a second alignment key under the first photoresist layer and a second alignment pattern aligned in the first direction, by exposing and developing the first photoresist layer; and
   forming a third alignment key aligned with the first alignment key in the first direction under the first photoresist layer and a fourth alignment key aligned with the second alignment key in the first direction on the etching target layer based on the first and second alignment patterns,
   wherein a distance between the first alignment pattern and the first photoresist layer in the first direction is different than a distance between the second alignment pattern and the first photoresist layer in the first direction.

2. The method of claim 1, wherein the third and fourth alignment keys are formed substantially at the same time.

3. The method of claim 1, wherein a first-direction distance between the third alignment key and the substrate is substantially the same as a first-direction distance between the fourth alignment key and the substrate.

4. The method of claim 1, wherein the first photoresist layer is in contact with the etching target layer.

5. The method of claim 1, further comprising:
   before the forming of the first photoresist layer, forming a first hard mask layer on the etching target layer.

6. The method of claim 5, further comprising:
   forming a second hard mask layer and a second photoresist layer on the etching target layer on which the third and fourth alignment keys are formed.

7. The method of claim 6, wherein the second hard mask layer is formed at a higher temperature than the first hard mask layer is formed.

8. The method of claim 6, wherein the second hard mask layer has lower transmittance than the first hard mask layer.

9. The method of claim 6, further comprising:
   forming a first contact hole that penetrates the etching target layer in the first direction and exposes a top surface of a first conductive pattern arranged at the same level as the first alignment key based on the second hard mask layer, the second photoresist layer, and the third alignment key.

10. A method of manufacturing a semiconductor device, the method comprising:
    forming a peripheral transistor, a first conductive pattern electrically connected to the peripheral transistor, and a first alignment key at the same level as the first conductive pattern on a substrate;
    forming a mold and a first upper insulating layer, wherein the mold comprises a plurality of sacrificial layers and a plurality of insulating layers alternately stacked on the substrate and the first upper insulating layer covers at least part of the mold;
    forming a plurality of channel structures that vertically penetrate the mold and a second alignment key that vertically penetrates the first upper insulating layer;
    removing the plurality of sacrificial layers and forming a plurality of gate electrodes in a residual space from which the plurality of sacrificial layers are removed;
    forming a second upper insulating layer on the first upper insulating layer;
    forming a first photoresist layer on the second upper insulating layer;
    forming a first alignment pattern vertically aligned with the first alignment key on the first photoresist layer;
    forming a second alignment pattern vertically aligned with the second alignment key on the first photoresist layer; and
    forming third and fourth alignment keys on the second upper insulating layer by using the first photoresist layer on which the first and second alignment patterns are formed, as an etching mask.

11. The method of claim 10, wherein a distance between the third alignment key and the substrate is substantially the same as a distance between the fourth alignment key and the substrate.

12. The method of claim 10, wherein the third alignment key and with the fourth alignment key are formed substantially at the same time.

13. The method of claim 10, further comprising:
    forming a first hard mask layer and a second photoresist layer on the second upper insulating layer;
    patterning the second photoresist layer based on the third alignment key; and forming a first contact hole that penetrates the first and second upper insulating layers and exposes a top surface of the first conductive pattern by using the first hard mask layer and the second photoresist layer which is patterned.

14. The method of claim 13, further comprising:
forming a second hard mask layer and a third photoresist layer on the second upper insulating layer;
patterning the third photoresist layer based on the fourth alignment key; and
forming a second contact hole that penetrates the first and second upper insulating layers and exposes a top surface of one of the plurality of gate electrodes by using the second hard mask layer and the third photoresist layer which is patterned.

15. A method of manufacturing a semiconductor device, the method comprising:
forming a peripheral transistor, a first conductive pattern electrically connected to the peripheral transistor, and a first alignment key at the same level as the first conductive pattern on a substrate;
forming a mold and a first upper insulating layer, wherein the mold comprises a plurality of sacrificial layers and a plurality of insulating layers that are alternately stacked on the substrate and the first upper insulating layer covers at least part of the mold;
forming a plurality of channel structures that vertically penetrate the mold and a second alignment key that vertically penetrates the first upper insulating layer;
removing the plurality of sacrificial layers and forming a plurality of gate electrodes in a space from which the plurality of sacrificial layers are removed;
forming a second upper insulating layer on the first upper insulating layer; and
forming third and fourth alignment keys on the second upper insulating layer,
wherein the third alignment key is vertically aligned with the first alignment key,
wherein the fourth alignment key is vertically aligned with the second alignment key, and
wherein the third and fourth alignment keys are formed substantially at the same time.

16. The method of claim 15, further comprising:
forming a first photoresist layer;
forming a first alignment pattern vertically aligned with the first alignment key on the first photoresist layer; and
forming a second alignment pattern vertically aligned with the second alignment key on the first photoresist layer.

17. The method of claim 16, wherein the third and fourth alignment keys are formed through an anisotropic etching process by using the first photoresist layer on which the first and second alignment patterns are formed, as an etching mask.

18. The method of claim 16, wherein the first photoresist layer is in contact with the second upper insulating layer.

19. The method of claim 16, further comprising:
forming a first hard mask layer and a second photoresist layer on the second upper insulating layer;
patterning the second photoresist layer based on the third alignment key;
forming a first contact hole that penetrates the first and second upper insulating layers and exposes a top surface of the first conductive pattern by using the first hard mask layer and the second photoresist layer which is patterned;
forming a second hard mask layer and a third photoresist layer on the second upper insulating layer;
patterning the third photoresist layer based on the fourth alignment key;
forming a second contact hole that penetrates the first and second upper insulating layers and exposes a top surface of one of the plurality of gate electrodes by using the second hard mask layer and the third photoresist layer which is patterned; and
providing a conductive material for filling the first and second contact holes.

\* \* \* \* \*